US012696671B2

(12) United States Patent
    Liu et al.

(10) Patent No.:     US 12,696,671 B2
(45) Date of Patent:        Jul. 28, 2026

(54) DISPLAY PANEL HAVING FUNCTIONAL DEVICE SETTING REGION AND DISPLAY APPARATUS

(71) Applicants:CHENGDU BOE OPTOELECTRONICS TECHNOLOGY CO., LTD., Chengdu (CN); BOE TECHNOLOGY GROUP CO., LTD., Beijing (CN)

(72) Inventors: Ke Liu, Beijing (CN); Puyu Qi, Beijing (CN); Dan Guo, Beijing (CN); Qiaoqiao Ru, Beijing (CN); Peng Hou, Beijing (CN); Qixiao Wu, Beijing (CN); Rui Zhou, Beijing (CN); Jingjing Xu, Beijing (CN); Ling Shi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 532 days.

(21) Appl. No.: 18/043,914

(22) PCT Filed: May 31, 2022

(86) PCT No.: PCT/CN2022/096458
    § 371 (c)(1),
    (2) Date: Mar. 3, 2023

(87) PCT Pub. No.: WO2023/230910
    PCT Pub. Date: Dec. 7, 2023

(65) Prior Publication Data
    US 2025/0048903 A1      Feb. 6, 2025

(51) Int. Cl.
    H10K 59/80          (2023.01)
    H10K 59/126         (2023.01)
            (Continued)

(52) U.S. Cl.
    CPC ....... H10K 59/8792 (2023.02); H10K 59/126 (2023.02); H10K 59/131 (2023.02); H10K 59/353 (2023.02); H10K 59/65 (2023.02)

(58) Field of Classification Search
    CPC .... G06V 40/1318; H10K 59/60; H10K 59/65; G02F 1/133512; G02F 1/136209; H01L 29/78633; H01L 27/14623; H01L 27/3272
    See application file for complete search history.

(56) References Cited

U.S. PATENT DOCUMENTS 10,756,136 B1      8/2020  Ma et al.
2017/0337873 A1    11/2017  Kim et al.
            (Continued)

FOREIGN PATENT DOCUMENTS

CN          109979980 A      7/2019
CN          110717580 A      1/2020
            (Continued)

OTHER PUBLICATIONS

PCT International Search Report and Written Opinion (w/ English translation) for corresponding PCT Application No. PCT/CN2022/095374, mailed Feb. 9, 2023, 16 pages.
            (Continued)

*Primary Examiner* — Yuzhen Shen

(74) *Attorney, Agent, or Firm* — Dority & Manning, P.A.

(57)           ABSTRACT

A display panel includes a substrate, and a plurality of first pixel circuits, a plurality of first light-emitting devices and a plurality of first light-shielding portions that are located in a functional device setting region. The plurality of first light-emitting devices are disposed on a side of the plurality
            (Continued)

of first pixel circuits away from the substrate. A first light-emitting device includes a first electrode electrically connected to a first pixel circuit. The plurality of first light-shielding portions are arranged at intervals on a side of the plurality of first light-emitting devices away from the substrate. Each first light-shielding portion is provided with a first opening therein, and each first opening corresponds to a single first light-emitting device. An orthographic projection of a first portion of the first pixel circuit on the substrate is located within an orthographic projection of a first light-shielding portion on the substrate.

17 Claims, 18 Drawing Sheets

(51) Int. Cl.
H10K 59/131 (2023.01)
H10K 59/35 (2023.01)
H10K 59/65 (2023.01)

(56) References Cited

U.S. PATENT DOCUMENTS

| | | | | |
|---|---|---|---|---|
| 2020/0013345 | A1 | 1/2020 | Jeong | |
| 2020/0373372 | A1 | 11/2020 | Chung et al. | |
| 2021/0005669 | A1* | 1/2021 | Kamada | H10K 59/126 |
| 2021/0118962 | A1 | 4/2021 | Shin et al. | |
| 2021/0193741 | A1 | 6/2021 | Chen | |
| 2021/0202621 | A1* | 7/2021 | Liang | H10K 59/60 |
| 2021/0265434 | A1 | 8/2021 | Wu et al. | |
| 2021/0334504 | A1 | 10/2021 | Lu | |
| 2021/0335221 | A1 | 10/2021 | Ma et al. | |
| 2021/0408194 | A1 | 12/2021 | Zhang | |
| 2022/0059805 | A1 | 2/2022 | Cho et al. | |
| 2022/0123062 | A1 | 4/2022 | Cho et al. | |
| 2022/0208863 | A1* | 6/2022 | Cho | H10K 59/131 |
| 2022/0246688 | A1* | 8/2022 | Park | H10K 59/12 |
| 2022/0320183 | A1 | 10/2022 | Bao et al. | |
| 2022/0320214 | A1 | 10/2022 | Qu et al. | |
| 2022/0320226 | A1 | 10/2022 | Yang et al. | |
| 2022/0344432 | A1 | 10/2022 | Shi et al. | |
| 2022/0376003 | A1 | 11/2022 | Wang et al. | |
| 2022/0376028 | A1 | 11/2022 | Huang et al. | |
| 2022/0415981 | A1 | 12/2022 | Shu et al. | |
| 2023/0039372 | A1 | 2/2023 | Wu | |
| 2023/0099301 | A1 | 3/2023 | Chen et al. | |
| 2023/0320169 | A1 | 10/2023 | Song et al. | |

FOREIGN PATENT DOCUMENTS

| | | |
|---|---|---|
| CN | 210575037 U | 5/2020 |
| CN | 111725288 A | 9/2020 |
| CN | 111739916 A | 10/2020 |
| CN | 113097281 A | 7/2021 |
| CN | 113161402 A | 7/2021 |
| CN | 113285044 A | 8/2021 |
| CN | 113437126 A | 9/2021 |
| CN | 113540200 A | 10/2021 |
| CN | 113674693 A | 11/2021 |
| CN | 114005864 A | 2/2022 |
| CN | 114093898 A | 2/2022 |
| CN | 114156308 A | 3/2022 |
| EP | 3660827 A1 | 6/2020 |
| EP | 4095937 A1 | 11/2022 |

OTHER PUBLICATIONS

PCT International Search Report and Written Opinion (w/ English translation) for corresponding PCT Application No. PCT/CN2022/096459, mailed Dec. 14, 2022, 18 pages.

U.S. Non-Final Office Action for corresponding U.S. Appl. No. 18/251,938, dated Jul. 22, 2025, 12 pages.

U.S. Non-Final Office Action for corresponding U.S. Appl. No. 18/254,968, dated Mar. 19, 2026, 25 pages.

* cited by examiner

16                                                                                          A2

DISPLAY PANEL HAVING FUNCTIONAL DEVICE SETTING REGION AND DISPLAY APPARATUS

CROSS-REFERENCE TO RELATED APPLICATION

This application is a national phase entry under 35 USC 371 of International Patent Application No. PCT/CN2022/096458, filed on May 31, 2022, which is incorporated herein by reference in its entirety.

TECHNICAL FIELD

The present disclosure relates to the field of display technologies, and in particular, to a display panel and a display apparatus.

BACKGROUND

With the rapid development of display technologies, display apparatuses have gradually spread throughout people's lives. Organic light-emitting diodes (OLEDs) are widely used in smart products such as mobile phones, televisions and notebook computers due to their advantages of self-illumination, low power consumption, wide viewing angle, fast response speed, high contrast and flexible display.

SUMMARY

In an aspect, a display panel is provided. The display panel has a functional device setting region, and the display panel includes a substrate, a plurality of first pixel circuits, a plurality of first light-emitting devices and a plurality of first light-shielding portions. The plurality of first pixel circuits are disposed on the substrate and located in the functional device setting region. The plurality of first light-emitting devices are disposed on a side of the plurality of first pixel circuits away from the substrate and located in the functional device setting region. A first light-emitting device includes a first electrode, the first electrode is electrically connected to a first pixel circuit, and a portion of an orthographic projection of the first pixel circuit on the substrate is located outside an orthographic projection of the first electrode on the substrate.

The plurality of first light shielding portions are arranged at intervals on a side of the plurality of first light-emitting devices away from the substrate and located in the functional device setting region. Each first light-shielding portion is provided with a first opening therein, and each first opening corresponds to a single first light-emitting device; a light-emitting region of the first light-emitting device is located in a corresponding first opening. An orthographic projection of a first portion of the first pixel circuit on the substrate is located within an orthographic projection of a first light-shielding portion on the substrate. The first portion is a portion, an orthographic projection of which on the substrate is located outside the orthographic projection of the first electrode on the substrate, of the first pixel circuit.

In some embodiments, an edge of the orthographic projection of the first electrode of the first light-emitting device on the substrate is located within the orthographic projection of the first light-shielding portion on the substrate.

In some embodiments, the first electrode includes a main body portion and a connection portion; the main body portion is configured to be as the light-emitting region, and the connection portion is electrically connected to the first pixel circuit. The first light-shielding portion includes a first light-shielding sub-portion and a second light-shielding sub-portion, and the orthographic projection of the first portion on the substrate is located within an orthographic projection of a first light-shielding sub-portion on the substrate. An edge of an orthographic projection of the main body portion on the substrate is located within the orthographic projection of the first light-shielding sub-portion on the substrate. An edge of an orthographic projection of the connection portion on the substrate is located within an orthographic projection of the second light-shielding sub-portion on the substrate.

In some embodiments, the plurality of first light-emitting devices include red light-emitting devices, green light-emitting devices and blue light-emitting devices. The plurality of first light-shielding portions include red light-shielding portions, green light-shielding portions and blue light-shielding portions. A first opening of a red light-shielding portion corresponds to a red light-emitting device, a first opening of a green light-shielding portion corresponds to a green light-emitting device, and a first opening of a blue light-shielding portion corresponds to a blue light-emitting device.

An edge of a light-emitting region of the red light-emitting device is substantially in a shape of a rhombus or a sector, and the first opening of the red light-shielding portion is substantially in a shape of a rhombus or a sector. And/or an edge of a light-emitting region of the green light-emitting device is substantially in a shape of a rectangle, and the first opening of the green light-shielding portion is substantially in a shape of a rectangle. And/or an edge of a light-emitting region of the blue light-emitting device is substantially in a shape of a rhombus or a sector, and the first opening of the blue light-shielding portion is substantially in a shape of a rhombus or a sector.

In some embodiments, an orthographic projection of the light-emitting region of the red light-emitting device on the substrate and an inner edge of an orthographic projection of the red light-shielding portion on the substrate have a first gap therebetween; an orthographic projection of the light-emitting region of the green light-emitting device on the substrate and an inner edge of an orthographic projection of the green light-shielding portion on the substrate have a second gap therebetween; and an orthographic projection of the light-emitting region of the blue light-emitting device on the substrate and an inner edge of an orthographic projection of the blue light-shielding portion on the substrate have a third gap therebetween. Widths of the first gap, the second gap and the third gap are substantially equal.

In some embodiments, each first light-shielding portion includes a first light-shielding sub-portion and a second light-shielding sub-portion. An outer edge of an orthographic projection of a first light-shielding sub-portion of the red light-shielding portion on the substrate is substantially in a shape of a rhombus or a sector; and/or an outer edge of an orthographic projection of a first light-shielding sub-portion of the green light-shielding portion on the substrate is substantially in a shape of a circle or an ellipse; and/or an outer edge of an orthographic projection of a first light-shielding sub-portion of the blue light-shielding portion on the substrate is substantially in a shape of a rhombus or a sector.

In some embodiments, the plurality of first pixel circuits are arranged in a plurality of rows and a plurality of columns, each row of first pixel circuits includes first pixel circuits arranged in a first direction, and each column of first pixel circuits includes first pixel circuits arranged in a second direction; the first direction is substantially perpendicular to the second direction. First pixel circuits in two adjacent rows are staggered from each other, and first pixel circuits in two adjacent columns are staggered from each other.

In some embodiments, the plurality of first light-shielding portions are arranged in a plurality of rows and a plurality of columns, each row of first light-shielding portions includes first light-shielding portions arranged in the first direction, and each column of first light-shielding portions includes first light-shielding portions arranged in the second direction. First light-shielding portions in two adjacent rows are staggered from each other, and first light-shielding portions in two adjacent columns are staggered from each other.

In some embodiments, the display panel includes a second electrode layer, and the second electrode layer is disposed between the first electrode and the first light-shielding portion. A portion of the second electrode layer located in the functional device setting region is provided with a plurality of second openings therein, and orthographic projections of the plurality of second openings on the substrate are each located in a region between orthographic projections of the plurality of first light-shielding portions on the substrate.

In some embodiments, the plurality of first light-shielding portions are arranged in a plurality of rows and a plurality of columns, each row of first light-shielding portions includes first light-shielding portions arranged in a first direction, and each column of first light-shielding portions includes first light-shielding portions arranged in a second direction; the first direction is substantially perpendicular to the second direction. A second opening is disposed between two adjacent first light-shielding portions in the first direction, and/or another second opening is disposed between two adjacent first light-shielding portions in the second direction.

In some embodiments, a second opening is substantially in a shape of a circle or an ellipse.

In some embodiments, the display panel further has a main display region, and the main display region at least partially surrounds the functional device setting region. The display panel further includes a plurality of second pixel circuits, a plurality of second light-emitting devices and a second light-shielding portion. The plurality of second pixel circuits are disposed on the substrate and located in the main display region. The plurality of second light-emitting devices are disposed on a side of the plurality of second pixel circuits away from the substrate and located in the main display region. A second light-emitting device includes a third electrode, the third electrode is electrically connected to a second pixel circuit, and a portion of an orthographic projection of the second pixel circuit on the substrate is located outside an orthographic projection of the third electrode on the substrate.

The second light-shielding portion is disposed on a side of the plurality of second light-emitting devices away from the substrate and located in the main display region. The second light-shielding portion includes a plurality of third openings, and each third opening corresponds to a single second light-emitting device. A light-emitting region of the second light-emitting device is located in a corresponding third opening. Orthographic projections of second portions of the plurality of second pixel circuits on the substrate are each located within an orthographic projection of the second light-shielding portion on the substrate. A second portion is a portion, an orthographic projection of which on the substrate is located outside the orthographic projection of the third electrode on the substrate, of the second pixel circuit.

In some embodiments, the plurality of first light-shielding portions and the second light-shielding portion are made of a same material and are disposed in a same layer.

In some embodiments, the plurality of second light-emitting devices include red light-emitting devices, green light-emitting devices and blue light-emitting devices. An edge of a light-emitting region of a red light-emitting device is substantially in a shape of a rhombus or a sector, and a third opening corresponding to the red light-emitting device in the second light-shielding portion is substantially in a shape of a rhombus or a sector; and/or an edge of a light-emitting region of a green light-emitting device is substantially in a shape of a rectangle, and a third opening corresponding to the green light-emitting device in the second light-shielding portion is substantially in a shape of a rectangle; and/or an edge of a light-emitting region of a blue light-emitting device is substantially in a shape of a rhombus or a sector, and a third opening corresponding to the blue light-emitting device in the second light-shielding portion is substantially in a shape of a rhombus or a sector.

In some embodiments, an orthographic projection of the light-emitting region of the red light-emitting device on the substrate and an edge of an orthographic projection of the third opening of the second light-shielding portion corresponding to the red light-emitting device on the substrate have a fourth gap therebetween. An orthographic projection of the light-emitting region of the green light-emitting device on the substrate and an edge of an orthographic projection of the third opening of the second light-shielding portion corresponding to the green light-emitting device on the substrate have a fifth gap therebetween. An orthographic projection of the light-emitting region of the blue light-emitting device on the substrate and an edge of an orthographic projection of the third opening of the second light-shielding portion corresponding to the blue light-emitting device on the substrate have a sixth gap therebetween. Widths of the fourth gap, the fifth gap and the sixth gap are substantially equal.

In some embodiments, the plurality of first light-emitting devices and the plurality of second light-emitting devices each include a plurality of red light-emitting devices, a plurality of first green light-emitting devices, a plurality of second green light-emitting devices and a plurality of blue light-emitting devices.

Red light-emitting devices and first green light-emitting devices are alternately arranged in a first oblique direction, and red light-emitting devices and second green light-emitting devices are alternately arranged in a second oblique direction. Blue light-emitting devices and second green light-emitting devices are alternately arranged in the first oblique direction, and blue light-emitting devices and first green light-emitting devices are alternately arranged in the second oblique direction. Red light-emitting devices and blue light-emitting devices are alternately arranged in a first direction and in a second direction, and first green light-emitting devices and second green light-emitting devices are alternately arranged in the first direction and in the second direction.

The first direction is substantially perpendicular to the second direction, the first oblique direction intersects with the second oblique direction, both the first oblique direction and the second oblique direction intersect with the first direction, and both the first oblique direction and the second oblique direction intersect with the second direction.

In some embodiments, in at least one of the first direction, the second direction, the first oblique direction and the second oblique direction, centers of light-emitting regions of any two adjacent first light-emitting devices have a substantially equal distance therebetween, and/or centers of light-emitting regions of any two adjacent second light-emitting devices have a substantially equal distance.

In some embodiments, the display panel further includes a plurality of first filter portions, each first filter portion corresponds to a single first opening, and an edge of an orthographic projection of the first filter portion on the substrate is located within an orthographic projection of a corresponding first light-shielding portion on the substrate. In a case where the display panel further includes a plurality of second sub-pixels and a second light-shielding portion, the display panel further includes a plurality of second filter portions, each second filter portion corresponds to a single third opening, and an edge of an orthographic projection of the second filter portion on the substrate is located within an orthographic projection of the second light-shielding portion on the substrate.

In some embodiments, the display panel further includes an encapsulation layer, and the encapsulation layer is disposed between the plurality of first light-shielding portions and the plurality of first light-emitting devices.

In some embodiments, the display panel further includes a plurality of signal lines electrically connected to the first pixel circuit. At least one signal line includes a signal trace for connecting an external signal source and a transitional connection line connected to the first pixel circuit, and a portion of the signal trace located in the functional device setting region is transparent.

In another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on an actual size of a product, an actual process of a method and an actual timing of signals involved in the embodiments of the present disclosure.

DETAILED DESCRIPTION

Figure 1:
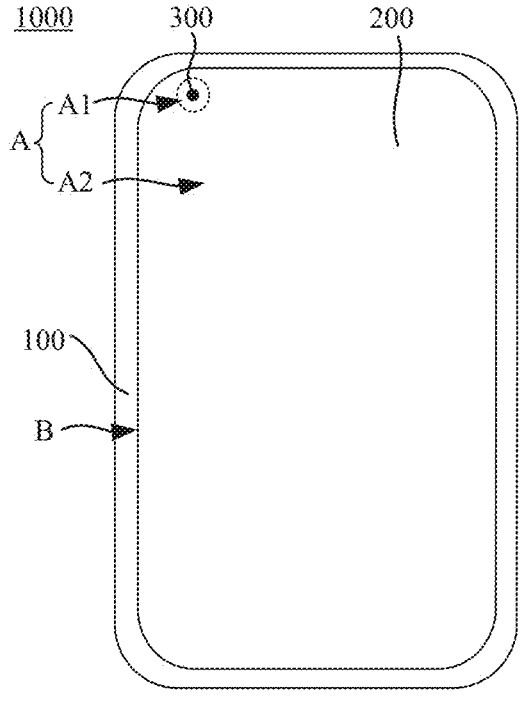
FIG. 1 is a structural diagram of a display apparatus, in accordance with some embodiments.

Technical solutions in some embodiments of the present disclosure will be described clearly and completely in combination with accompanying drawings below. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and claims, the term "comprise/include" and other forms thereof such as the third-person singular form "comprises/includes" and the present participle form "comprising/including" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying a relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "electrically connected" and derivatives thereof may be used. For example, the term "connected" may be used in the description of some embodiments to indicate that two or more components are in direct physical or electrical contact with each other. The embodiments disclosed herein are not necessarily limited to the content herein. For another example, the term "electrically connected" may be used in the description of some embodiments to indicate that two or more components are in direct electrical contact or indirect electrical connection with each other. The embodiments disclosed herein are not necessarily limited to the content herein.

The phrase "at least one of A, B and C" has the same meaning as the phrase "at least one of A, B or C", and they both include following combinations of A, B and C: only A, only B, only C, a combination of A and B, a combination of A and C, a combination of B and C, and a combination of A, B and C.

The phrase "A and/or B" includes following three combinations: only A, only B. and a combination of A and B.

The usage of the phrase "applicable to" or "configured to" herein means an open and inclusive language, which does not exclude devices that are applicable to or configured to perform additional tasks or steps.

In addition, the use of the phrase "based on" or "according to" is meant to be open and inclusive, since a process, step, calculation or other action that is "based on" or "according to" one or more of the stated conditions or values may, in practice, be based on additional conditions or values exceeding those stated.

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or the substrate, and there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Transistors used in a pixel driving circuit (i.e., a pixel circuit) provided in the embodiments of the present disclosure may be thin film transistors (TFTs), metal-oxide-semiconductor field effect transistors (MOS FETs), or other switching devices with the same characteristics. The embodiments of the present disclosure are described by considering TFTs as an example.

In addition, the pixel driving circuit (i.e., the pixel circuit) provided in the embodiments of the present disclosure will be described by considering an example in which the TFTs are all P-type transistors. It will be noted that the embodiments of the present disclosure include the example but are not limited thereto. For example, one or more TFTs in the pixel driving circuit provided in the embodiments of the present disclosure may be N-type transistor(s). For the couple manner of electrodes of selected-type TFTs, reference may be made to the couple manner of electrodes of corresponding TFTs in the embodiments of the present disclosure, and corresponding voltage terminals are each enabled to provide a corresponding high-level voltage or low-level voltage.

Herein, a control electrode of each TFT used in the pixel driving circuit (i.e., the pixel circuit) is a gate of the TFT, a first electrode thereof is one of a source and a drain of the TFT, and a second electrode thereof is the other of the source and the drain of the TFT. Since the source and the drain of the TFT may be symmetrical in structure, the source and the drain thereof may be indistinguishable in structure. That is, the first electrode and the second electrode of the TFT in the embodiments of the present disclosure may be indistinguishable in structure. For example, in a case where the TFT is a P-type transistor, the first electrode of the TFT is a source, and the second electrode thereof is a drain. For another example, in a case where the TFT is an N-type transistor, the first electrode of the TFT is a drain, and the second electrode thereof is a source.

In the pixel driving circuit (i.e., the pixel circuit) provided in the embodiments of the present disclosure, a capacitor may be a capacitor device manufactured separately through a process. For example, the capacitor device is realized by manufacturing specialized capacitor electrodes, and each capacitor electrode of the capacitor may be implemented by a metal layer, a semiconductor layer (e.g., doped polysilicon), or the like. The capacitor may alternatively be a parasitic capacitor between transistors, or implemented by the transistors and other devices or by the transistors and lines, or implemented by using the parasitic capacitor between lines of the circuit itself.

Referring to FIG. 1, some embodiments of the present disclosure provide a display apparatus 1000. The display apparatus 1000 may be any apparatus that displays images whether in motion (e.g., a video) or stationary (e.g., a still image), and whether textual or graphical. For example, the display apparatus 1000 may be any product or component having a display function such as a television, a notebook computer, a tablet computer, a mobile phone, a personal digital assistant (PDA), a navigator, a wearable device, or a virtual reality (VR) device.

Here, the display apparatus 1000 is an electroluminescent display apparatus or a photoluminescent display apparatus. In a case where the display apparatus 1000 is the electroluminescent display apparatus, the electroluminescent display apparatus may be an organic light-emitting diode (OLED) display apparatus or a quantum dot light-emitting diode (QLED) display apparatus. In a case where the display apparatus 1000 is the photoluminescent display apparatus, the photoluminescent display apparatus may be a quantum dot photoluminescent display apparatus.

Figure 2:
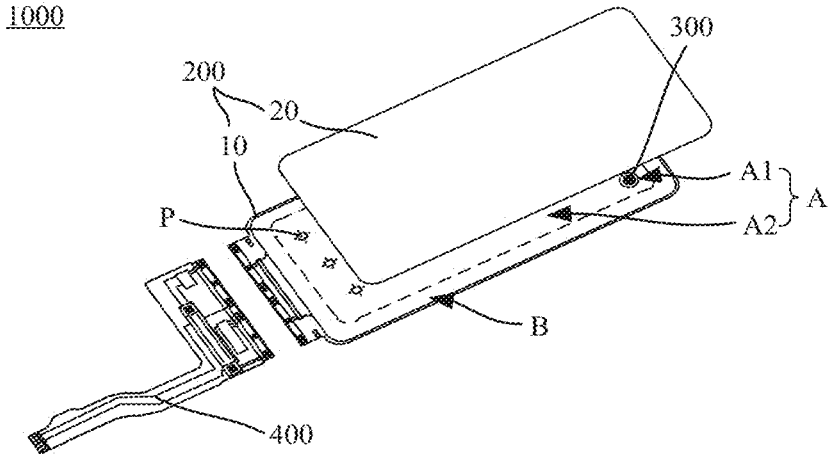
FIG. 2 is an exploded view of a display apparatus, in accordance with some embodiments.

In some embodiments, referring to FIGS. 1 and 2, the display apparatus 1000 includes a housing 100, and a display panel 200, a functional device 300, a circuit board 400 and other electronic components which are disposed in the housing 100.

The circuit board 400 may be bonded to the display panel 200 at an end of the display panel 200 and bent to a back side of the display panel 200, so as to realize the design of a full screen. The functional device 300 may be integrated under the display panel 200 to realize the design of the full screen.

It will be noted that the functional device 300 may be a camera, an infrared sensor, a proximity sensor, an eyeball tracking module, a face recognition module, or the like. For example, as shown in FIGS. 1 and 2, the functional device 300 is a camera.

Figure 3:
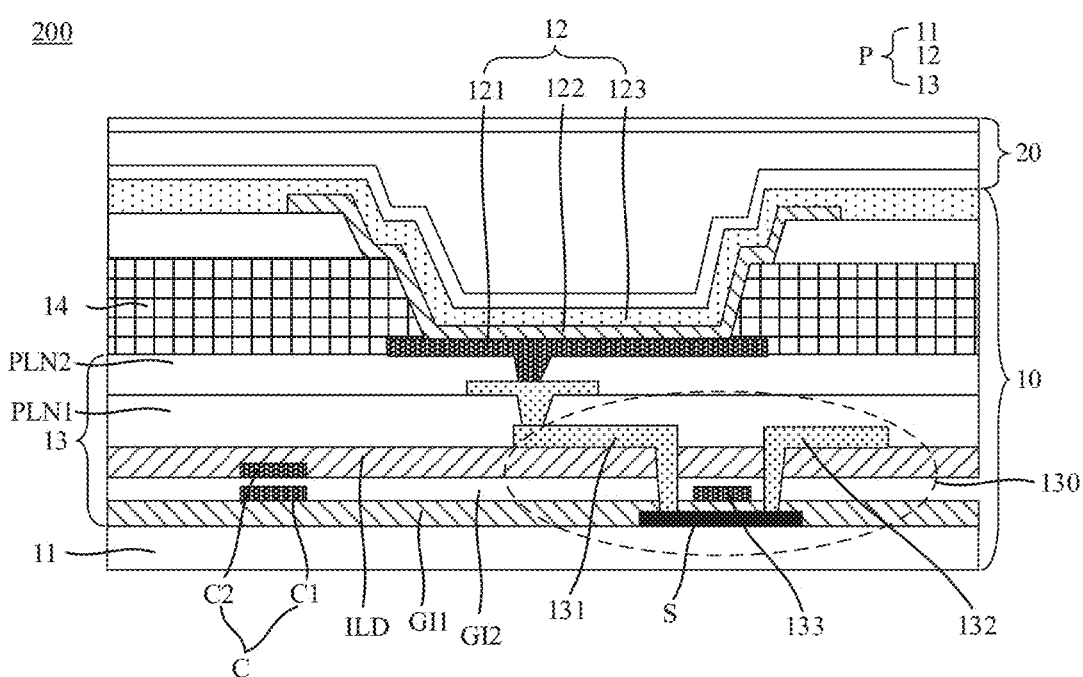
FIG. 3 is a sectional view of a display panel, in accordance with some embodiments.

In some embodiments, as shown in FIGS. 2 and 3, the display panel 200 includes a display substrate 10 and an encapsulation layer 20 for encapsulating the display substrate 10.

The display substrate 10 has a light exit side and a non-light exit side that are oppositely arranged, and the encapsulation layer 20 is disposed on the light exit side of the display substrate 10. Here, the encapsulation layer 20 may be an encapsulation film or an encapsulation substrate.

Referring to FIG. 2, the display panel 200 has a display region A and a peripheral region B disposed on at least one side of the display region A. FIG. 2 illustrates an example where the peripheral region B is disposed around the display region A.

The display region A is a region for displaying images, and is configured to provide a plurality of sub-pixels P therein. The peripheral region B is a region where no image is displayed, and the peripheral region B is configured to provide therein display driving circuits, such as a gate driver circuit and a source driver circuit.

It will be noted that, in a case where the functional device 300 is integrated under the display panel 200, the display region A has a functional device setting region A1 and a main display region A2 at least partially surrounding the functional device setting region A1, and the functional device 300 is located in the functional device setting region A1. FIGS. 1 and 2 illustrate an example where the main display region A2 is provided around the functional device setting region A1.

For example, referring to FIG. 2, the display region A of the display panel 200 is provided with a plurality of sub-pixels P therein, which may include sub-pixels P of various light-emitting colors. For example, the sub-pixels P of various light-emitting colors include a red sub-pixel, a green sub-pixel and a blue sub-pixel.

Referring to FIG. 3, the display panel 200 includes a substrate 11, and each sub-pixel P includes a light-emitting device 12 and a pixel driving circuit 13 that are disposed on the substrate 11. The pixel driving circuit 13 includes a plurality of transistors 130, each of which includes a channel portion S, a source 131, a drain 132 and a gate 133, and the source 131 and the drain 132 are in contact with the channel portion S. In a direction perpendicular to the substrate 11 and away from the substrate 11, the light-emitting device 12 includes a first electrode 121, a light-emitting functional layer 122 and a second electrode 123.

Figure 6A:
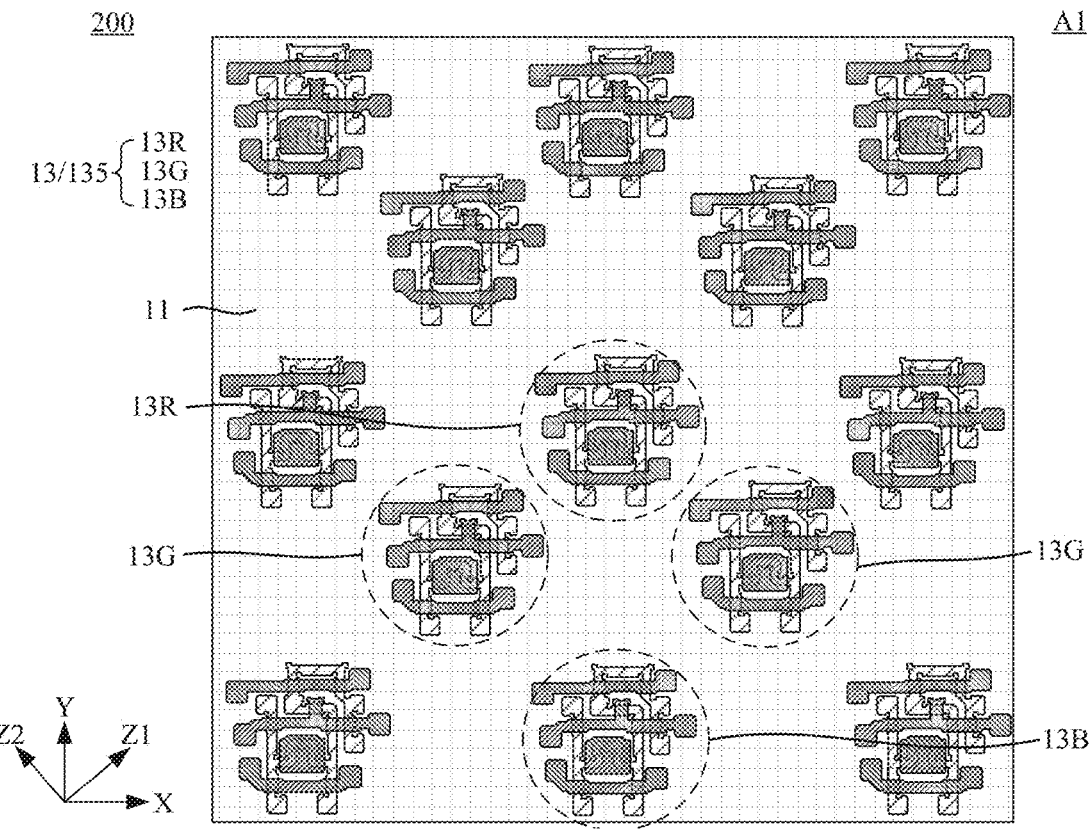
FIG. 6A is a top view of a layout of pixel circuits in a functional device setting region of a display panel, in accordance with some embodiments.
Figure 6B:
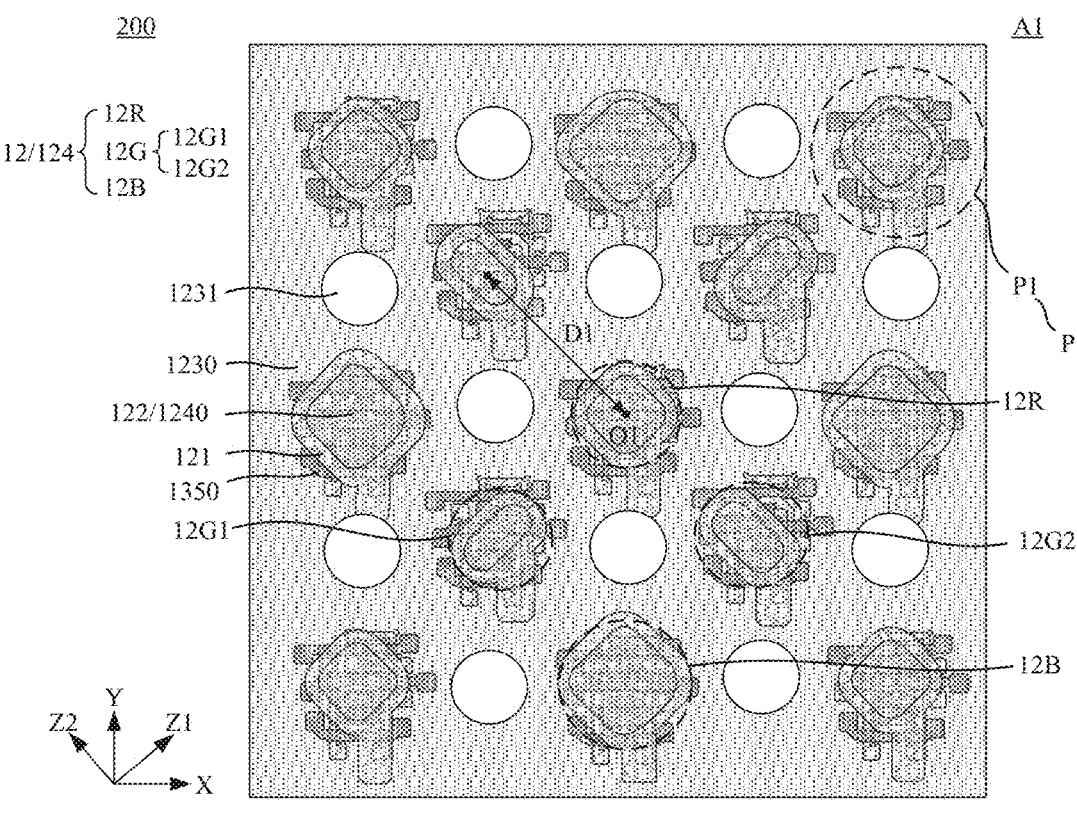
FIG. 6B is a top view of an arrangement of light-emitting devices in a functional device setting region of a display panel, in accordance with some embodiments.

Here, referring to FIGS. 6A and 6B, a portion of an orthographic projection of the pixel driving circuit 13 on the substrate 11 is located outside an orthographic projection of the first electrode 121 on the substrate 11, that is, a portion of a border of the pixel driving circuit 13 is not shielded by the first electrode 121.

It will be noted that, for convenience of illustration, the pixel circuit 13 mentioned below refers to the pixel driving circuit 13 described above.

Here, the first electrode 121 is an anode of the light-emitting device 12, and the second electrode 123 is a cathode of the light-emitting device 12. Alternatively, the first electrode 121 is the cathode of the light-emitting device 12, and the second electrode 123 is the anode of the light-emitting device 12.

For example, as shown in FIG. 3, the first electrode 121 is the anode of the light-emitting device 12, and the second electrode 123 is the cathode of the light-emitting device 12. The first electrode 121 is electrically connected to a source 131 or drain 132 of a transistor 130 of the pixel circuit 13. FIG. 3 illustrates an example where the first electrode 121 is electrically connected to the source 131 of the transistor 130 of the pixel circuit 13.

In some embodiments, the light-emitting functional layer 122 includes only a light-emitting layer. In some other embodiments, in addition to the light-emitting layer, the light-emitting functional layer 122 further includes at least one of an electron transporting layer (ETL), an electron injection layer (EIL), a hole transporting layer (HTL) and a hole injection layer (HIL).

In addition, the pixel circuit 13 varies in structure, which may be set according to actual needs. For example, the structure of the pixel circuit 13 may include a "2T1C" structure, a "3T1C" structure, a "6T1C" structure, a "7T1C" structure, a "6T2C" structure, a "7T2C" structure or the like, where "T" represents a transistor, the number in front of "T" represents the number of transistors, "C" represents a storage capacitor, and the number in front of "C" represents the number of storage capacitors.

During using the display panel 200, the stability of the transistors in the pixel circuit 13 and the light-emitting device 12 may be reduced (e.g., a threshold voltage of a driving transistor drifts), so that the display effect of the display panel 200 may be affected. Thus, it is necessary to perform compensation on the pixel circuit 13.

A manner in which the pixel circuit 13 is compensated may be various, and may be selected according to actual needs. For example, a pixel compensation circuit may be provided in the pixel circuit 13, so as to perform internal compensation on the pixel circuit 13 by using the pixel compensation circuit. For another example, the driving transistor or the light-emitting device may be sensed by a transistor inside the pixel circuit 13, and the sensed data is transmitted to an external sensing circuit, so as to use the external sensing circuit to calculate a driving voltage that needs to be compensated and perform feedback, thereby realizing external compensation for the pixel circuit 13.

The structure and the operation process of the pixel circuit 13 will be schematically illustrated in embodiments of the present disclosure by considering an example where the internal compensation is used and the pixel circuit 13 adopts the "7T1C" structure.

Figure 4:
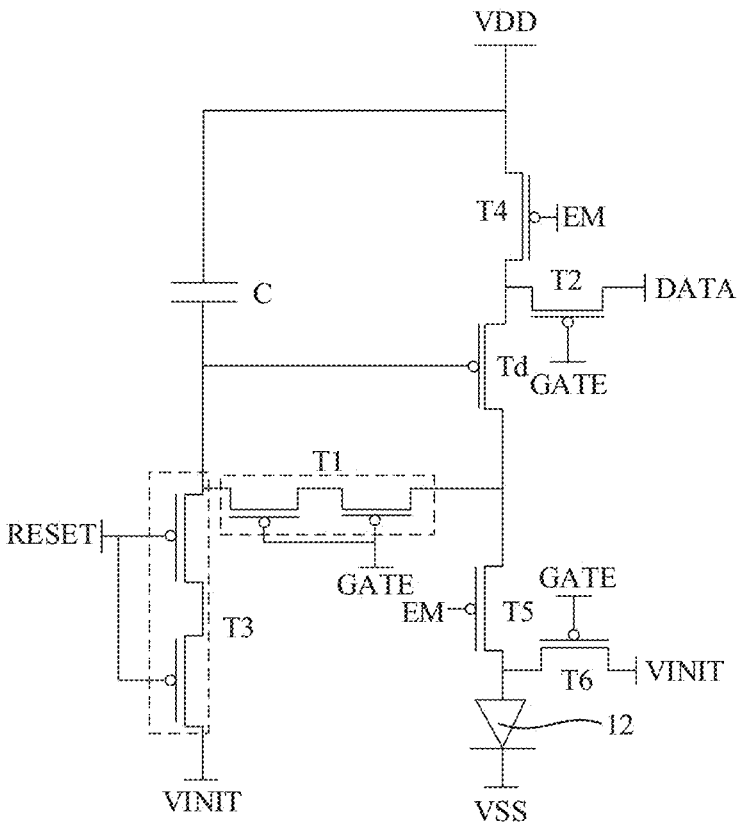
FIG. 4 is a circuit schematic diagram of a pixel driving circuit, in accordance with some embodiments.

For example, as shown in FIG. 4, the pixel circuit 13 may include a first transistor T1, a second transistor T2, a third transistor T3, a fourth transistor T4, a fifth transistor T5, a sixth transistor T6, a driving transistor Td and a storage capacitor C.

A control electrode of the first transistor T1 is electrically connected to a scanning signal terminal GATE, a first electrode of the first transistor T1 is electrically connected to a second electrode of the driving transistor Td, and a second electrode of the first transistor T1 is electrically connected to a control electrode of the driving transistor Td.

A control electrode of the second transistor T2 is electrically connected to the scanning signal terminal GATE, a first electrode of the second transistor T2 is electrically connected to a data signal terminal DATA, and a second electrode of the second transistor T2 is electrically connected to a first electrode of the driving transistor Td.

A control electrode of the third transistor T3 is electrically connected to a reset signal terminal RESET, a first electrode of the third transistor T3 is electrically connected to an initialization signal terminal VINIT, and a second electrode of the third transistor T3 is electrically connected to the control electrode of the driving transistor Td.

A control electrode of the fourth transistor T4 is electrically connected to an enable signal terminal EM, a first electrode of the fourth transistor T4 is electrically connected to a first voltage signal terminal VDD, and a second electrode of the fourth transistor T4 is electrically connected to the first electrode of the driving transistor Td.

A control electrode of the fifth transistor T5 is electrically connected to the enable signal terminal EM, a first electrode of the fifth transistor T5 is electrically connected to the second electrode of the driving transistor Td, and a second electrode of the fifth transistor T5 is electrically connected to the first electrode 121 of the light-emitting device 12 (referring to FIG. 3).

A control electrode of the sixth transistor T6 is electrically connected to the scanning signal terminal GATE, a first electrode of the sixth transistor T6 is electrically connected to the initialization signal terminal VINIT, and a second electrode of the sixth transistor T6 is electrically connected to the first electrode 121 of the light-emitting device 12 (referring to FIG. 3).

A first electrode plate C1 of the storage capacitor C (referring to FIG. 3) is electrically connected to the control electrode of the driving transistor Td, and a second electrode plate C2 of the storage capacitor C (referring to FIG. 3) is electrically connected to the first voltage signal terminal VDD.

Figure 5:
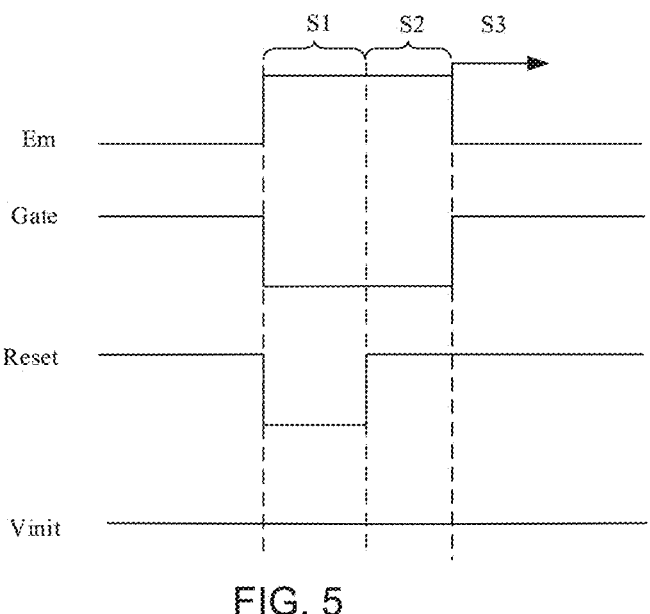
FIG. 5 is a timing diagram of a pixel driving circuit, in accordance with some embodiments.

Based on the structure of the pixel circuit 13, as shown in FIGS. 4 and 5, in a frame display phase, an operation process of the sub-pixel may include, for example, a reset phase S1, a data writing phase S2 and a light-emitting phase S3.

In the reset phase S1, the sixth transistor T6 is turned on under control of a scanning signal Gate from the scanning signal terminal GATE, a voltage of the first electrode of the light-emitting device 12 is reset to an initialization voltage signal Vinit, and the third transistor T3 is turned on under control of a reset signal Reset from the reset signal terminal RESET, and a voltage of the control electrode of the driving transistor Td and a voltage of the first electrode plate C1 of the storage capacitor C are reset to the initialization voltage signal Vinit.

In the data writing phase S2, the first transistor T1 and the second transistor T2 are turned on under the control of the scanning signal Gate from the scanning signal terminal GATE, the driving transistor Td is turned on under control of the initialization voltage signal stored in the storage capacitor C, and a data signal Data from the data signal terminal DATA is written into the storage capacitor C.

In the light-emitting phase S3, the fourth transistor T4 and the fifth transistor T5 are turned on under control of an enable signal Em from the enable signal terminal EM to output a driving current signal to the light-emitting device 12, so as to drive the light-emitting device 12 to emit light.

In some embodiments, as shown in FIG. 3, the display substrate 10 further includes a pixel defining layer 14, which is disposed on a side of the first electrode 121 away from the substrate 11. The pixel defining layer 14 includes a plurality of openings, and a light-emitting device 12 is disposed in an opening, that is, the light-emitting functional layer 122 of the light-emitting device 12 is in electrical contact with the first electrode 121 in the opening.

It will be noted that, in order to reduce the process difficulty, an area of the first electrode 121 is larger than an area of the opening of the pixel defining layer 14, so as to ensure that a region where the opening of the pixel defining layer 14 is located is a light-emitting region of the light-emitting device 12. That is, a portion where the first electrode 121, the second electrode 123 and the light-emitting functional layer 122 overlap constitutes the light-emitting region of the light-emitting device 12, namely, portions of the first electrode 121, the second electrode 123 and the light-emitting functional layer 122 corresponding to the region where the opening of the pixel defining layer 14 is located constitute the light-emitting region of the light-emitting device 12.

It can be understood that in the case where the functional device 300 is integrated under the display panel 200, if a light transmittance of the display panel 200 is low, the light sensitivity of the functional device 300 under the display panel 200 may be affected; and if a reflectivity of the display panel 200 is high, the display effect of the display panel 200 may be affected.

Based on this, in some related arts, a polarizer is provided on a light exit side of a display panel, so as to reduce reflection intensity of external ambient light on the display panel. However, light exiting from the display panel will have 50% to 60% loss after passing through the polarizer, that is, the polarizer may greatly reduce the transmittance of the display apparatus, thereby leading to an increase in the power consumption of the display apparatus and affecting the light sensitivity of the camera under the display panel. Moreover, since the portion of the border of the pixel circuit is not shielded by the first electrode, the external ambient light, after being reflected by the portion of the border, may produce a serious diffraction phenomenon, resulting in a decrease in the light sensitivity of the functional device.

In some other related arts, the light exit side of the display panel is provided with a color filter layer to instead of the polarizer. However, the reflection intensity of the external ambient light on the display panel is still large compared with a case where the polarizer is provided on the light exit side of the display panel, especially in a region where the camera is located. In order to ensure the light sensitivity of the functional device, the region where the camera is located cannot use a light-shielding layer to completely cover a region between sub-pixels, and the reflection intensity of the functional device setting region is too large, which affects the display effect. Moreover, since the portion of the border of the pixel circuit is not shielded by the first electrode, the external ambient light, after being reflected by the portion of the border, may produce a serious diffraction phenomenon, resulting in a decrease in the light sensitivity of the functional device.

Figure 6C:
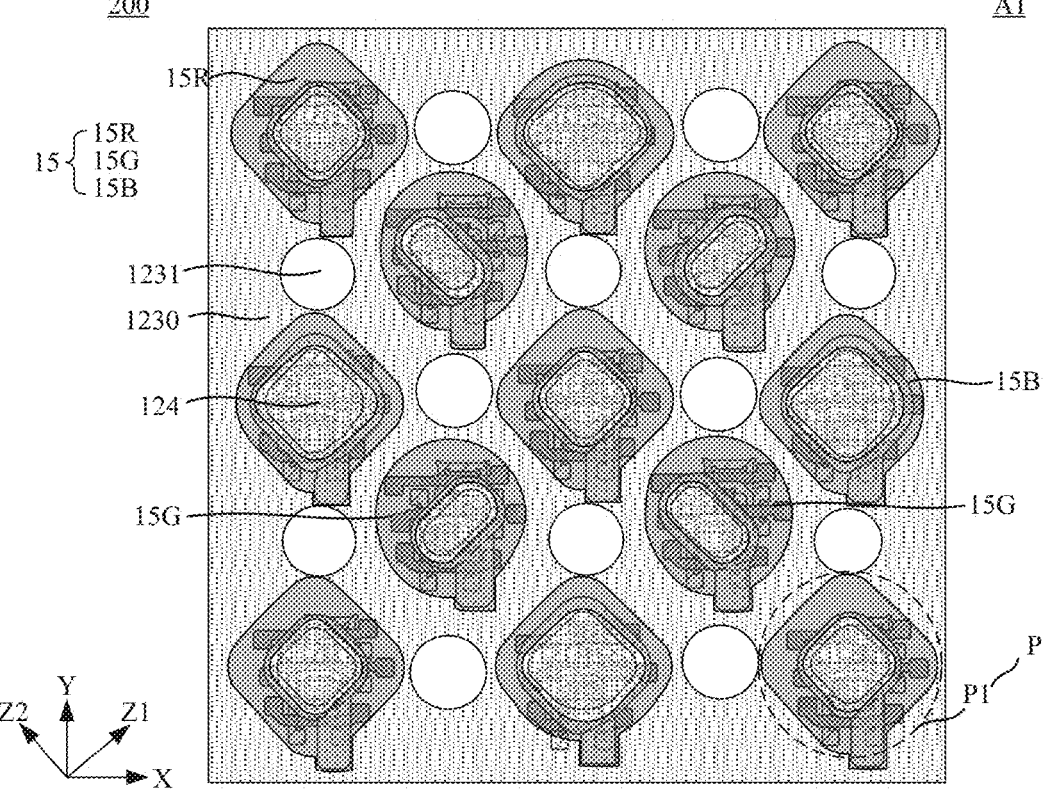
FIG. 6C is a top view of a functional device setting region of a display panel that is provided with first light-shielding portions, in accordance with some embodiments.
Figure 6D:
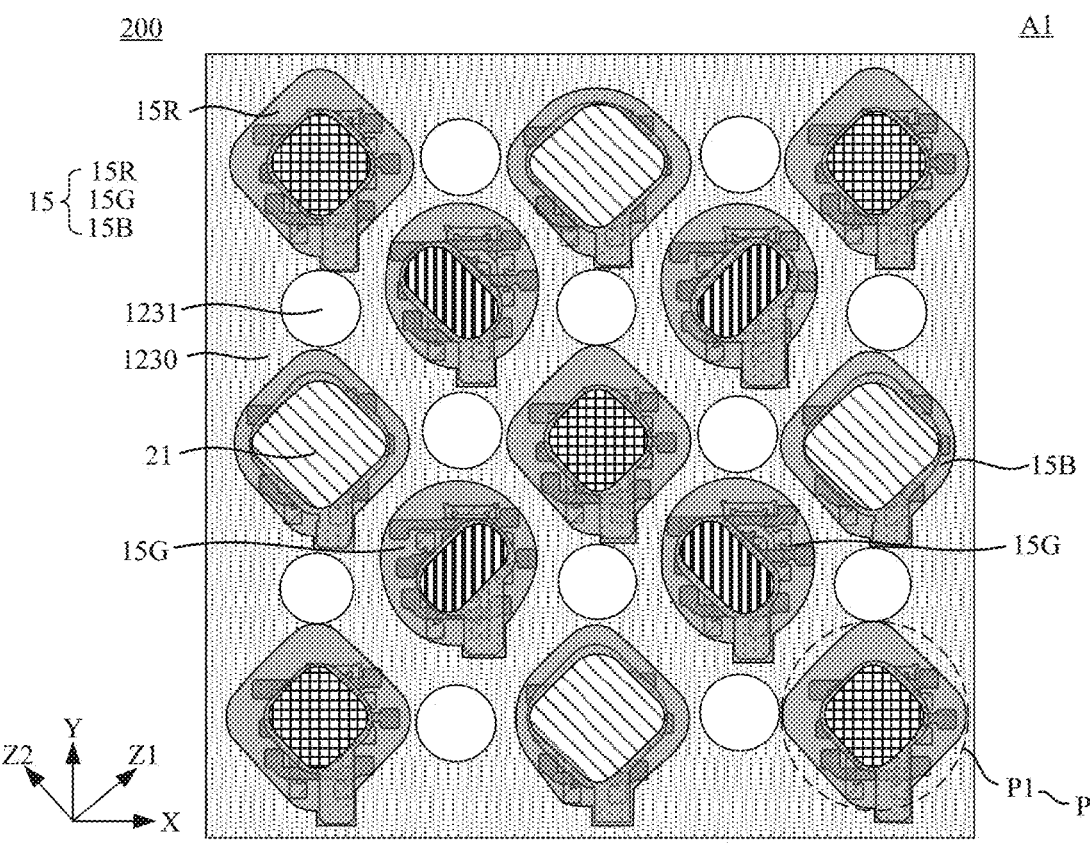
FIG. 6D is a top view of a functional device setting region of another display panel that is provided with first light-shielding portions, in accordance with some embodiments.

In light of this, the display panel 200 provided by some embodiments of the present disclosure, referring to FIGS. 6C and 6D, further includes a plurality of first light-shielding portions 15.

Figure 9A:
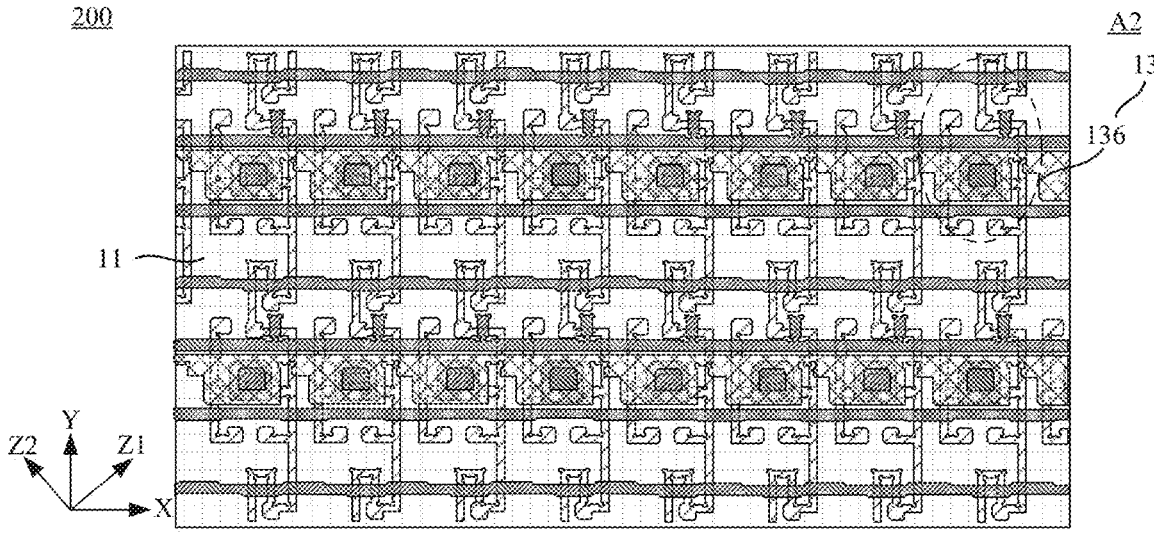
FIG. 9A is a top view of a layout of pixel circuits in a main display region of a display panel, in accordance with some embodiments.
Figure 9B:
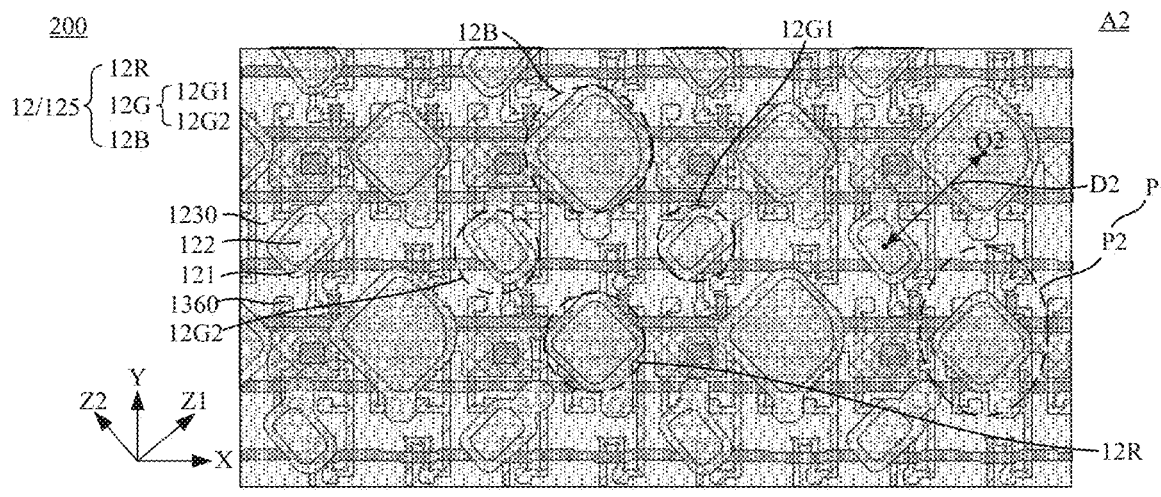
FIG. 9B is a top view of an arrangement of light-emitting devices in a main display region of a display panel, in accordance with some embodiments.

It will be noted that, in order to distinguish sub-pixels P, light-emitting devices 12 and pixel circuits 13 in the functional device setting region A1 from sub-pixels P, light-emitting devices 12 and pixel circuits 13 in the main display region A2, referring to FIGS. 6A and 6B, the sub-pixels P, the light-emitting devices 12 and the pixel circuits 13 located in the functional device setting region A1 are respectively referred to as first sub-pixels P1, first light-emitting devices 124 and first pixel circuits 135 herein, and referring to FIGS. 9A and 9B, the sub-pixels P, the light-emitting devices 12 and the pixel circuits 13 located in the main display region A2 are respectively referred to as second sub-pixels P2, second light-emitting devices 125 and second pixel circuits 136 herein.

Figure 7A:
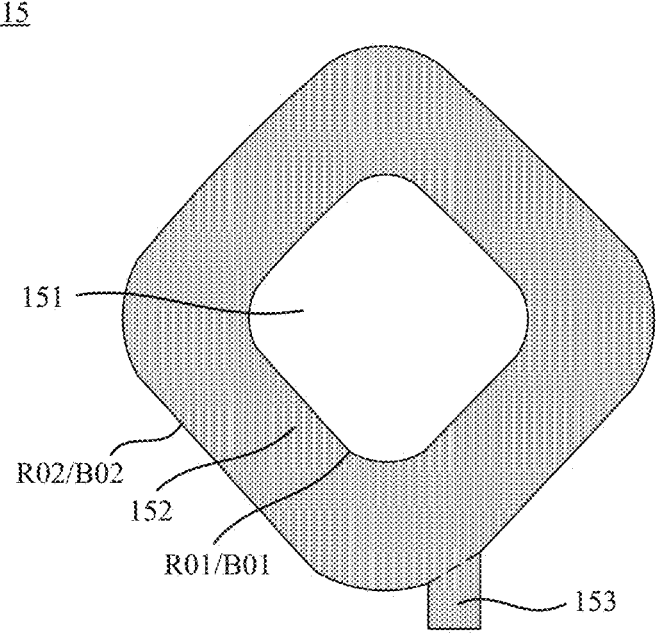
FIG. 7A is a structural diagram of a red light-shielding portion or a blue light-shielding portion of a display panel, in accordance with some embodiments.
Figure 8A:
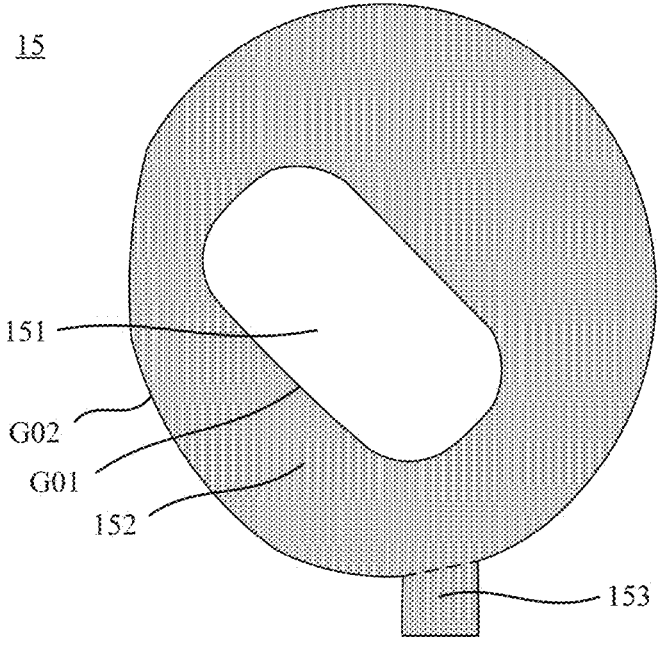
FIG. 8A is a structural diagram of a green light-shielding portion of a display panel, in accordance with some embodiments.

FIGS. 6A to 6D are top views of the functional device setting region of the display panel in accordance with some embodiments. FIG. 7A is a structural diagram of a red light-shielding portion or a blue light-shielding portion of the display panel in accordance with some embodiments. FIG. 8A is a structural diagram of a green light-shielding portion of the display panel in accordance with some embodiments.

As shown in FIGS. 6C and 6D, the plurality of first light-shielding portions 15 are arranged at intervals on a side of the first light-emitting devices 124 away from the substrate 11 and located in the functional device setting region A1. For example, the plurality of first light-shielding portions 15 are disposed on a side of the encapsulation layer 20 away from the substrate 11, that is, the encapsulation layer 20 is located between the plurality of first light-shielding portions 15 and the first light-emitting devices 124. As shown in FIGS. 6C, 6D and 7A, each first light-shielding portion 15 is provided with a first opening 151 therein, each first opening 151 corresponds to a first light-emitting device 124, and a light-emitting region 1240 of the first light-emitting device 124 is located in the corresponding first opening 151.

Referring to FIGS. 6A to 6D, an orthographic projection of a first portion 1350 of a first pixel circuit 135 on the substrate 11 is located within an orthographic projection of a first light-shielding portion 15 on the substrate 11. The first portion is a portion, an orthographic projection of which on the substrate 11 is outside the orthographic projection of the first electrode 121 on the substrate 11, of the first pixel circuit 135.

In this case, in the functional device setting region A1, the orthographic projection of the first portion of the first pixel circuit 135 on the substrate 11 is located within the orthographic projection of the first light-shielding portion 15 on the substrate 11. That is, an orthographic projection of the first pixel circuit 135 on the substrate 11 is located within an orthographic projection of a whole of the first electrode 121 and the first light-shielding portion 15 on the substrate 11. In this way, it may be possible to avoid direct irradiation of external ambient light on the first pixel circuit 135, to reduce the reflection intensity of the external ambient light on the functional device setting region A1 of the display panel 200, and to eliminate the diffraction phenomenon caused by direct irradiation of the external ambient light on a border of the first pixel circuit 135, so as to improve the light sensitivity of the functional device 300. Moreover, a channel portion S of a transistor 130 (e.g., the first transistor T1) in the first pixel circuit 135 may be shielded by the first electrode 121 and the first light-shielding portion 15, thereby reducing the risk of drift of a threshold voltage of the transistor 130, improving the accuracy of the driving current, and improving the display effect of the functional device setting region A1 of the display panel 200.

In some embodiments, referring to FIGS. 6B and 6C, in the functional device setting region A1, an edge of an orthographic projection of a first electrode 121 of each of the first light-emitting devices 124 on the substrate 11 is located within the orthographic projection of the first light-shielding portion 15 on the substrate 11.

Figure 17:
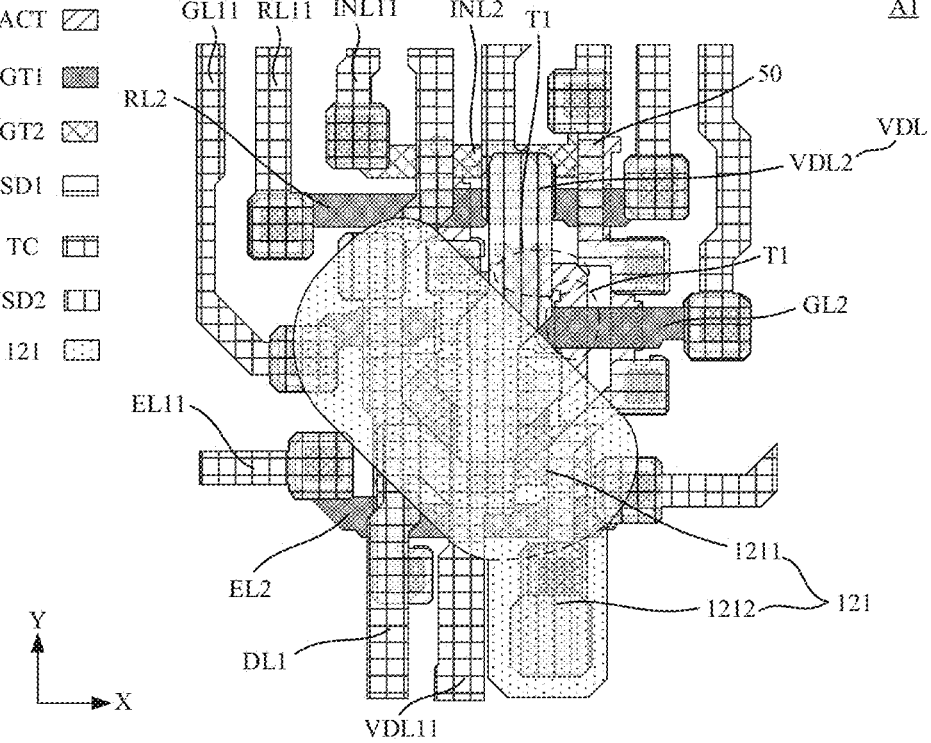
FIG. 17 is a top view of the functional device setting region shown in FIG. 16 after a first electrode is added on the second source-drain conductive layer.

For example, as shown in FIGS. 3, 6B and 17, the first electrode 121 includes a main body portion 1211 and a connection portion 1212.

The main body portion 1211 is configured to form a light-emitting region, and an orthographic projection of the opening of the pixel defining layer 14 on the substrate 11 is located within an orthographic projection of the main body portion 1211 on the substrate 11. The connection portion 1212 is electrically connected to the first pixel circuit 135.

On this basis, as shown in FIGS. 6C, 6D, 7A and 8A, the first light-shielding portion 15 includes a first light-shielding sub-portion 152 and a second light-shielding sub-portion 153. The orthographic projection of the first portion of the first pixel circuit 135 on the substrate 11 is located within an orthographic projection of the first light-shielding sub-portion 152 on the substrate 11. An edge of the orthographic projection of the main body portion 1211 of the first electrode 121 on the substrate 11 is within the orthographic projection of the first light-shielding sub-portion 152 on the substrate 11. An edge of an orthographic projection of the connection portion 1212 of the first electrode 121 on the substrate 11 is located within an orthographic projection of the second light-shielding sub-portion 153 on the substrate 11.

In this way, it may be possible to prevent the external ambient light from directly irradiating the connection portion 1212 of the first electrode 121 of the first light-emitting device 124, and to further reduce the reflection intensity of the external ambient light on the functional device setting region A1 of the display panel 200, so as to improve the light sensitivity of the functional device 300.

In some embodiments, as shown in FIGS. 6B and 6C, the first light-emitting devices 124 include red light-emitting devices 12R, green light-emitting devices 12G and blue light-emitting devices 12B.

Referring to FIG. 6B, an edge of a light-emitting region of a red light-emitting device 12R and an edge of a light-emitting region of a blue light-emitting device 12B are each substantially in a shape of a rhombus or a sector, and an edge of a light-emitting region of a green light-emitting device 12G is substantially in a shape of a rectangle.

In addition, an area of the light-emitting region of the blue light-emitting device 12B may be larger than an area of the light-emitting region of the red light-emitting device 12R, and the area of the light-emitting region of the red light-emitting device 12R may be larger than an area of the light-emitting region of the green light-emitting device 12G.

It will be noted that the description of "substantially in the shape of the rhombus" herein means that the shape is rhombic overall, but is not limited to a standard rhombus. That is, the "rhombus" here includes not only a substantially rhombic shape, but also a shape similar to a rhombus in view of process conditions. For example, the corners of the rhombus are curved, that is, the corners are smooth.

It will be noted that the description of "substantially in the shape of the sector" herein means that the shape is sectorial overall, but is not limited to a standard sector. That is, the "sector" here includes not only a substantially sectorial shape, but also a shape similar to a sector in view of process conditions. For example, arc segments of the sector have unequal curvatures.

It will be noted that the description of "substantially in the shape of the rectangle" herein means that the shape is rectangular overall, but is not limited to a standard rectangle. That is, the "rectangle" here includes not only a substantially rectangular shape, but also a shape similar to a rectangle in view of process conditions. For example, the corners of the rectangle are curved, that is, the corners are smooth.

Referring to FIGS. 6C, 6D, 7A and 8A, in the functional device setting region A1, the plurality of first light-shielding portions 15 include red light-shielding portions 15R, green light-shielding portions 15G and blue light-shielding portions 15B.

Referring to FIGS. 6C, 6D and 7A, a first opening 151 of a red light-shielding portion 15R is substantially in a shape of a rhombus or a sector, so as to match the shape of the light-emitting region of the red light-emitting device 12R. For example, the edge of the light-emitting region of the red light-emitting device 12R is substantially in the shape of the rhombus, and the first opening 151 of the red light-shielding portion 15R is substantially in the shape of the rhombus.

Referring to FIGS. 60, 6D and 8A, a first opening 151 of a green light-shielding portion 15G is substantially in a shape of a rectangle, so as to match the shape of the light-emitting region of the green light-emitting device 12G. For example, the edge of the light-emitting region of the green light-emitting device 12G is substantially in the shape of the rectangle, and the first opening 151 of the green light-shielding portion 15G is substantially in the shape of the rectangle.

Referring to FIGS. 6C, 6D and 7A, a first opening 151 of a blue light-shielding portion 15B is substantially in a shape of a rhombus or a sector, so as to match the shape of the light-emitting region of the blue light-emitting device 12B. For example, the edge of the light-emitting region of the blue light-emitting device 12B is substantially in the shape of the rhombus, and the first opening 151 of the blue light-shielding portion 15B is substantially in the shape of the rhombus.

That is, inner edges of orthographic projections of the red light-shielding portion 15R and the blue light-shielding portion 15B on the substrate 11 are substantially rhombic or sectorial, and an inner edge of an orthographic projection of the green light-shielding portion 15G on the substrate 11 is substantially rectangular.

Figure 7B:
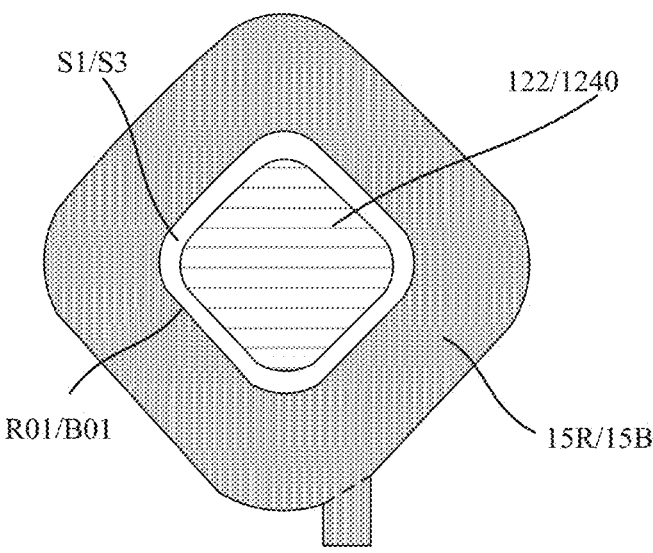
FIG. 7B is a diagram showing a relative positional relationship between a light-emitting region and a red light-shielding portion or a blue light-shielding portion in a functional device setting region of a display panel, in accordance with some embodiments.

Here, referring to FIGS. 6B, 6C and 7B, there is a first gap S1 between the inner edge R01 of the orthographic projection of the red light-shielding portion 15R on the substrate 11 and an orthographic projection of the light-emitting region of the red light-emitting device 12R on the substrate 11 (referring to FIG. 3).

Figure 8B:
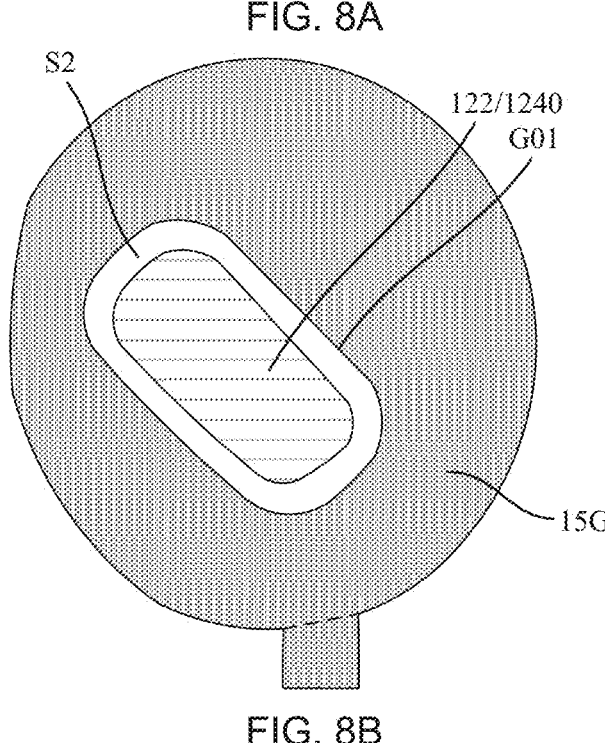
FIG. 8B is a diagram showing a relative positional relationship between a light-emitting region and a green light-shielding portion in a functional device setting region of a display panel, in accordance with some embodiments.

Referring to FIGS. 6B, 6C and 8B, there is a second gap S2 between the inner edge G01 of the orthographic projection of the green light-shielding portion 15G on the substrate 11 and an orthographic projection of the light-emitting region of the green light-emitting device 12G on the substrate 11 (referring to FIG. 3).

Referring to FIGS. 6B, 6C and 7B, there is a third gap S3 between the inner edge B01 of the orthographic projection of the blue light-shielding portion 15B on the substrate 11 and an orthographic projection of the light-emitting region of the blue light-emitting device 12B on the substrate 11 (referring to FIG. 3).

It will be noted that a region where the light-emitting functional layer 122 is located in FIGS. 7B and 8B may be regarded as the light-emitting region of the light-emitting device 12.

A width of the first gap S1, a width of the second gap S2 and a width of the third gap S3 are substantially equal, so as to avoid the problem of non-uniform brightness or color shift between the first sub-pixels P1, thereby improving the display effect of the functional device setting region A1 of the display panel 200.

On this basis, referring to FIGS. 6A and 6B, the first pixel circuits 135 include red pixel circuits 13R respectively electrically connected to the red light-emitting devices 12R, green pixel circuits 13G respectively electrically connected to the green light-emitting devices 12G, and blue pixel circuits 13B respectively electrically connected to the blue light-emitting devices 12B.

Referring to FIGS. 6A and 6B, outside each side of the orthographic projection of the light-emitting region of the red light-emitting device 12R on the substrate 11, there is a portion of an orthographic projection of a red pixel circuit 13R on the substrate 11, and a maximum distance between each side and the portion of the orthographic projection of the red pixel circuit 13R outside the side on the substrate 11 is substantially constant.

Based on this, in the functional device setting region A1, referring to FIGS. 6C and 7A, an outer edge R02 of an orthographic projection of the first light-shielding sub-portion 152 of the red light-shielding portion 15R on the substrate 11 is substantially in a shape of a rhombus or a sector. For example, the first opening 151 of the red light-shielding portion 15R is substantially in the shape of the rhombus, and the outer edge of the orthographic projection of the first light-shielding sub-portion 152 of the red light-shielding portion 15R on the substrate 11 is substantially in the shape of the rhombus. Based on the above, both the inner edge and the outer edge of the orthographic projection of the first light-shielding sub-portion 152 of the red light-shielding portion 15R on the substrate 11 are rhombic, which may make the process difficulty low.

Referring to FIGS. 6A and 6B, outside each side of the orthographic projection of the light-emitting region of the blue light-emitting device 12B on the substrate 11, there is a portion of an orthographic projection of a blue pixel circuit 13B on the substrate 11, and a maximum distance between each side and the portion of the orthographic projection of the blue pixel circuit 13B outside the side on the substrate 11 is substantially constant.

Based on this, referring to FIGS. 6C and 7A, an outer edge B02 of an orthographic projection of the first light-shielding sub-portion 152 of the blue light-shielding portion 15B on the substrate 11 is substantially in a shape of a rhombus or a sector. For example, the first opening 151 of the blue light-shielding portion 15B is substantially in the shape of the rhombus, and the outer edge of the orthographic projection of the first light-shielding sub-portion 152 of the blue light-shielding portion 15B on the substrate 11 is substantially in the shape of the rhombus. Based on the above, both the inner edge and the outer edge of the orthographic projection of the first light-shielding sub-portion 152 of the blue light-shielding portion 15B on the substrate 11 are rhombic, which may make the process difficulty low.

Referring to FIGS. 6A and 6B, outside each side of the orthographic projection of the light-emitting region of the green light-emitting device 12G on the substrate 11, there is a portion of an orthographic projection of a green pixel circuit 13G on the substrate 11, and a maximum distance between at least one of four sides and the portion of the orthographic projection of the green pixel circuit 13G outside the side on the substrate 11 is greater than a maximum distance between any of remaining sides and the portion of the orthographic projection of the green pixel circuit 13G outside the side on the substrate 11.

Based on this, referring to FIGS. 6C and 8A, an outer edge G02 of an orthographic projection of the first light-shielding sub-portion 152 of the green light-shielding portion 15G on the substrate 11 is substantially in a shape of a circle or an ellipse. In this way, it is possible to make a first portion of the green pixel circuit 13G located under the green light-light-shielding section 15G in a case where the green light-light-shielding section 15G occupies a small area and the process difficulty is low.

It will be noted that the description of "substantially in the shape of the circle or ellipse" herein means that the shape is circular or elliptical overall, but is not limited to a standard circle or ellipse. That is, the "circle or ellipse" here includes not only a substantially circular or elliptical shape, but also a shape similar to a circle or ellipse in view of process conditions. For example, a portion of an edge of a circle or ellipse is of a straight line.

In some embodiments, referring to FIG. 6B, the first light-emitting devices 124 include the red light-emitting devices 12R, first green light-emitting devices 12G1, second green light-emitting devices 12G2 and the blue light-emitting devices 12B, so as to improve the display effect of the display panel 200.

Red light-emitting devices 12R and first green light-emitting devices 12G1 are alternately arranged in a first oblique direction Z1, and red light-emitting devices 12R and second green light-emitting devices 12G2 are alternately arranged in a second oblique direction Z2. Blue light-emitting devices 12B and second green light-emitting devices 12G2 are alternately arranged in the first oblique direction Z1, and blue light-emitting devices 12B and first green light-emitting devices 12G1 are alternately arranged in the second oblique direction Z2. Red light-emitting devices 12R and blue light-emitting devices 12B are alternately arranged in a first direction X and a second direction Y, and first green light-emitting devices 12G1 and second green light-emitting devices 12G2 are alternately arranged in the first direction X and the second direction Y.

It will be noted that the first direction X is substantially perpendicular to the second direction Y, the first oblique direction Z1 intersects with the second oblique direction Z2, and both the first oblique direction Z1 and the second oblique direction Z2 intersect with the first direction X, and both the first oblique direction Z1 and the second oblique direction Z2 intersect with the second direction Y.

Here, in at least one of the first direction X, the second direction Y, the first oblique direction Z1 and the second oblique direction Z2, centers O1 of light-emitting regions of any two adjacent first light-emitting devices 124 have a substantially equal distance D1 therebetween. For example, in any of the first direction X, the second direction Y, the first oblique direction Z1 and the second oblique direction Z2, centers of light-emitting regions of any two adjacent first light-emitting devices 124 have a substantially equal distance therebetween.

It will be noted that the second oblique direction Z2 intersects with the first direction X, the second direction Y and the first oblique direction Z1. For example, the second oblique direction Z2 is substantially perpendicular to the first oblique direction Z1; an included angle between the second oblique direction Z2 and the first direction X is substantially in a range of 130° to 140°, and an included angle between the second oblique direction Z2 and the second direction Y is substantially in a range of 40° to 50°; an included angle between the first oblique direction Z1 and the first direction X is substantially in a range of 40° to 50°, and an included angle between the first oblique direction Z1 and the second direction Y is substantially in a range of 40° to 50°.

In addition, in order to increase the transmittance of the functional device setting region A1 of the display panel 200, the first pixel circuits 135 in the functional device setting region A1 are compactly designed. That is, a region occupied by the first pixel circuits 135 as a whole is smaller than a region occupied by the second pixel circuits 136 in the main display region A2. As a result, the transmittance of the functional device setting region A1 of the display panel 200 may be improved, which is conducive to light collection by the functional device 300.

For example, in the functional device setting region A1, as shown in FIG. 6A, the first pixel circuits 135 are arranged in a plurality of rows and a plurality of columns, each row of first pixel circuits 135 includes first pixel circuits 135 arranged in the first direction X, and each column of first pixel circuits 135 includes first pixel circuits 135 arranged in the second direction Y. First pixel circuits 135 in two adjacent rows are staggered from each other, and first pixel circuits 135 in two adjacent columns are staggered from each other. The first direction X is substantially perpendicular to the second direction Y.

On this basis, referring to FIG. 6C, the first light-shielding portions 15 may be arranged in a plurality of rows and a plurality of columns, each row of first light-shielding portions 15 includes first light-shielding portions 15 arranged in the first direction X, and each column of first light-shielding portions 15 includes first light-shielding portions 15 arranged in the second direction Y. The first direction X is substantially perpendicular to the second direction Y. First light-shielding portions 15 in two adjacent rows are staggered from each other, and first light-shielding portions 15 in two adjacent columns are staggered from each other.

In some embodiments, as shown in FIGS. 3 and 6B, the display panel 200 further includes a second electrode layer 1230. The second electrode layer 1230 includes second electrodes 123 of the light-emitting devices 12, and the second electrode layer 1230 is disposed between the first electrodes 121 and the first light-shielding portion 15.

Referring to FIGS. 6B and 6C, a portion of the second electrode layer 1230 located in the functional device setting region A1 is provided with a plurality of second openings 1231 therein, and orthographic projections of the plurality of second openings 1231 on the substrate 11 are each located in a region between orthographic projections of the first light-shielding portions 15 on the substrate 11. In this way, an area of a portion of the second electrode layer 1230 located between the first light-shielding portions 15 may be reduced, the external ambient light reflected by the second electrode layer 1230 may be reduced, and the reflection intensity of the external ambient light on the functional device setting region A1 of the display panel 200 may further be reduced.

It will be understood that the second opening 1231 may be disposed between any two adjacent first light-shielding portions 15. For example, in a case where the first light-shielding portions 15 are arranged in the plurality of rows and the plurality of columns, and each row of first light-shielding portions 15 includes the first light-shielding portions 15 arranged in the first direction X and each column of first light-shielding portions 15 includes the first light-shielding portions 15 arranged in the second direction Y, the second opening 1231 may be disposed between two adjacent first light-shielding portions 15 in the first direction X, and may also be disposed between two adjacent first light-shielding portions 15 in the second direction Y.

As shown in FIG. 6C, in a case where the first light-shielding portions 15 in two adjacent rows are staggered from each other, and the first light-shielding portions 15 in two adjacent columns are staggered from each other, the second opening 1231 is located between two adjacent first light-shielding portions 15 in the first direction X, and located between two adjacent first light-shielding portions 15 in the second direction Y. In this case, since an area of a region between two adjacent first light-shielding portions 15 in the first direction X and between two adjacent first light-shielding portions 15 in the second direction Y are large, the process difficulty of patterning the second electrode layer 1230 is low, that is, it is convenient to provide the second openings 1231 in the second electrode layer 1230.

Here, the second opening 1231 is substantially in a shape of a circle or an ellipse. It will be understood that the circle or ellipse may enable an area of the second opening 1231 to be set large, that is, an area of the portion of the second electrode layer 1230 between the first light-shielding portions 15 may be reduced, thereby reducing the reflection intensity of the external ambient light on the functional device setting region A1 of the display panel 200.

It will be noted that "in the shape of the circle or ellipse" herein means that the shape is circular or elliptical overall, but is not limited to a standard circle or ellipse. That is, the "circle or ellipse" here includes not only a substantially circular or elliptical shape, but also a shape similar to a circle or ellipse in view of process conditions. For example, a portion of an edge of a circle or ellipse is of a straight line.

It will be understood that, referring to FIG. 6B, the first light-emitting device 124 may be configured to emit white light, or may be configured to emit light of a single color.

For example, referring to FIG. 6C, the first light-emitting device 124 is configured to emit light of the single color, and the light of the single color is directly emitted to the outside of the display panel 200.

For example, as shown in FIGS. 6B and 6C, the first light-emitting devices 124 include the red light-emitting devices 12R, the first green light-emitting devices 12G1, the second green light-emitting devices 12G2 and the blue light-emitting devices 12B. The red light-emitting devices 12R are configured to emit red light, the green light-emitting devices 12G are configured to emit green light, and the blue light-emitting devices 12B are configured to emit blue light, so as to achieve color display.

Figure 7C:
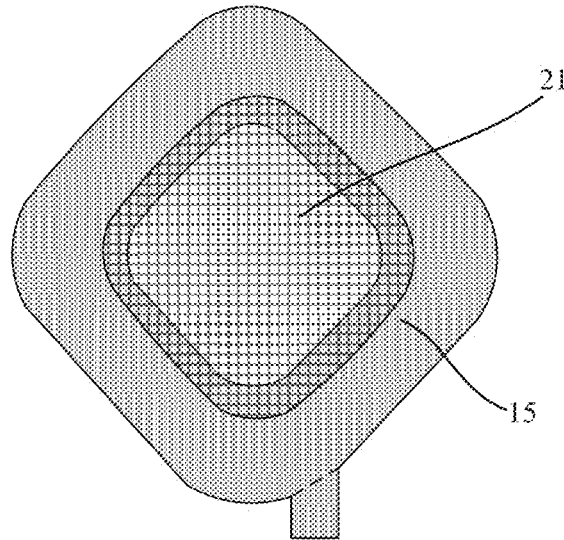
FIG. 7C is a diagram showing a relative positional relationship between a red light-shielding portion or a blue light-shielding portion and a first light-filtering portion in a functional device setting region of a display panel, in accordance with some embodiments.
Figure 8C:
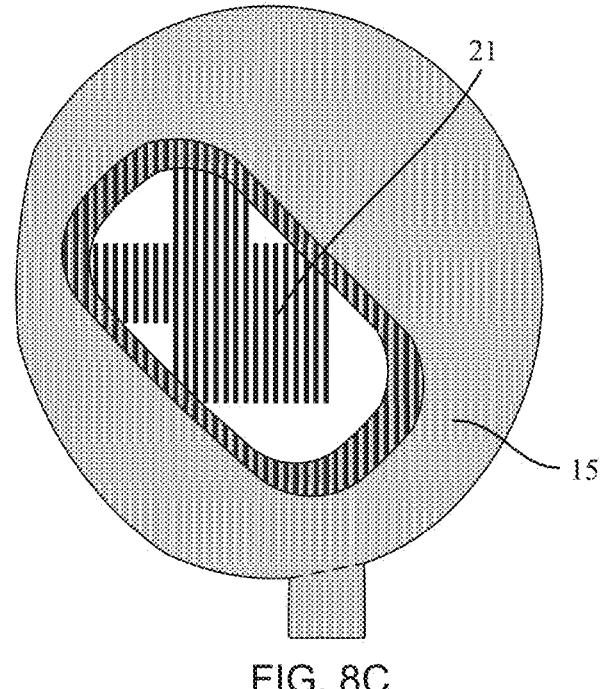
FIG. 8C is a diagram showing a relative positional relationship between a green light-shielding portion and a first light-filtering portion in a functional device setting region of a display panel, in accordance with some embodiments.

Here, the display panel 200 may further include a plurality of first filter portions 21, and each first filter portion 21 corresponds to a first opening 151 (referring to FIGS. 7A and 8A). In combination with FIGS. 7C and 8C, an edge of an orthographic projection of a first filter portion 21 on the substrate 11 is located within an orthographic projection of a corresponding first light-shielding portion 15 on the substrate 11, so as to filter the light emitted by the first light-emitting device 124 and prevent the first light-shielding portion 15 from interfering with the light collection by the functional device 300 (referring to FIG. 1).

The plurality of first filter portions 21 may each transmit one of a variety of monochromatic lights. Light emitted by the red light-emitting device 12R is irradiated on the first filter portion 21 for transmitting red light, light emitted by the blue light-emitting device 12B is irradiated on the first filter portion 21 for transmitting blue light, and light emitted by the green light-emitting device 12G is irradiated on the first filter portion 21 for transmitting green light. Since the first filter portion 21 transmits monochromatic light, the first filter portion 21 may filter out light within most wavelength ranges in the external ambient light, thereby further reducing the reflection intensity of the external ambient light on the functional device setting region A1 of the display panel 200. Thus, an anti-reflection polarizer (a circular polarizer) may not be provided on a display side of the display panel 200.

For example, as shown in FIGS. 6B and 6D, the first light-emitting devices 124 are all configured to emit white light. In this case, the display panel 200 further includes the plurality of first filter portions 21, and each first filter portion 21 corresponds to the first opening 151 (referring to FIGS. 7A and 8A). In combination with FIGS. 7C and 8C, the edge of the orthographic projection of the first filter portion 21 on the substrate 11 is located within the orthographic projection of the corresponding first light-shielding portion 15 on the substrate 11, so as to filter the light emitted by the first light-emitting device 124 and prevent the first light-shielding portion 15 from interfering with the light collection of the functional device 300 (referring to FIG. 1).

The plurality of first filter portions 21 may each transmit one of a variety of monochromatic lights, and the white light emitted by the first light-emitting device 124 is irradiated on the corresponding first filter portion 21 to emit monochromatic light of a corresponding color, so as to realize full-color display.

For example, as shown in FIGS. 6B and 6D, the first light-emitting devices 124 include the red light-emitting devices 12R, the first green light-emitting devices 12G1, the second green light-emitting devices 12G2 and the blue light-emitting devices 12B. The first filter portion 21 of the red light-emitting device 12R may transmit red light, the first filter portions 21 of the first green light-emitting device 12G1 and the second green light-emitting device 12G2 may transmit green light, and the first filter portion 21 of the blue light-emitting device 12B may transmit blue light. In this case, white lights emitted by the red light-emitting devices 12R, the first green light-emitting devices 12G1, the second green light-emitting devices 12G2 and the blue light-emitting devices 12B are irradiated on respective first filter portions 21 to emit monochromatic light of corresponding colors, thereby realizing full-color display.

In addition, since the first filter portion 21 transmits monochromatic light, the first filter portion 21 may filter out light within most wavelength ranges in the external ambient light, thereby further reducing the reflection intensity of the external ambient light on the functional device setting region A1 of the display panel 200. Thus, the anti-reflection polarizer (the circular polarizer) may not be provided on the display side of the display panel 200.

FIGS. 9A to 9D are top views of the main display region of the display panel in accordance with some embodiments. FIG. 10A is a structural diagram of a second light-shielding portion of the display panel in accordance with some embodiments.

As shown in FIGS. 9A to 9D, the display panel 200 further includes a second light-shielding portion 16 located in the main display region A2, and the second light-shielding portion 16 is disposed on a side of the second sub-pixels P2 away from the substrate 11.

It will be noted that the first light-shielding portions 15 and the second light-shielding portion 16 may be made of the same material and disposed in the same layer.

Figure 9C:
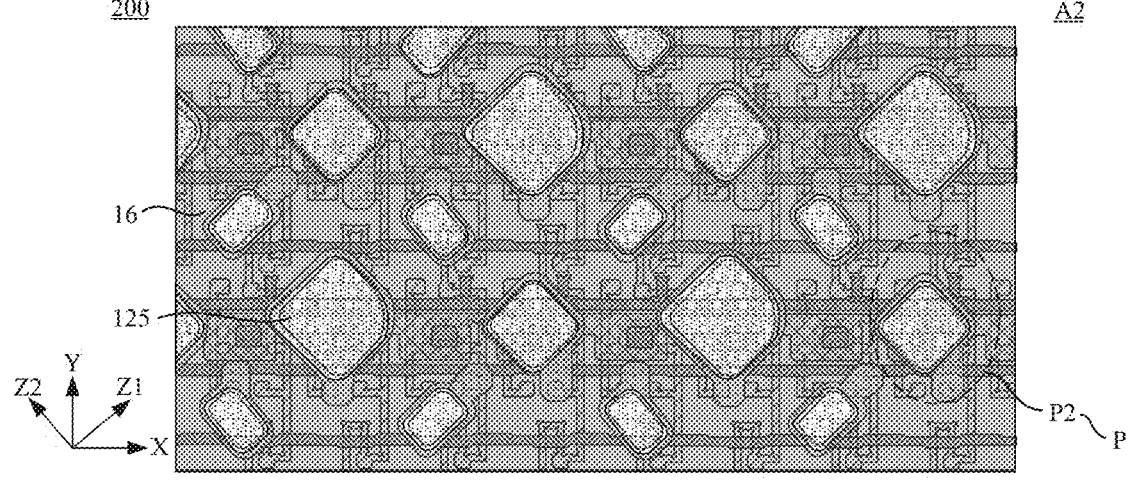
FIG. 9C is a top view of a main display region of a display panel that is provided with second light-shielding portions, in accordance with some embodiments.
Figure 10A:
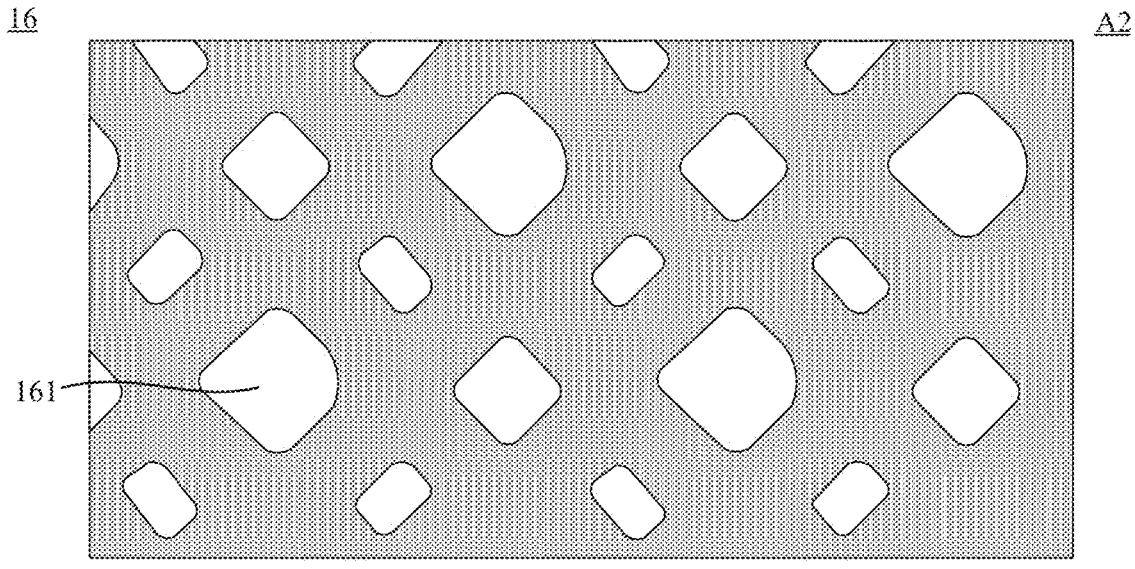
FIG. 10A is a structural diagram of a second light-shielding portion of a display panel, in accordance with some embodiments.

Referring to FIGS. 9B, 9C and 10A, the second light-shielding portion 16 includes a plurality of third openings 161, each third opening 161 corresponds to a second light-emitting device 125, and a light-emitting region of the second light-emitting device 125 is located in the corresponding third opening 161.

Referring to FIGS. 9A to 9D, an orthographic projection of a second portion 1360 of a second pixel circuit 136 on the substrate 11 is located within an orthographic projection of a second light-shielding portion 16 on the substrate 11. The second portion is a portion, an orthographic projection of which on the substrate 11 is located outside the orthographic projection of the third electrode 121 on the substrate 11, of the second pixel circuit 136.

It will be noted that, in order to distinguish the first electrode 121 of the second light-emitting device 125 from the first electrode 121 of the first light-emitting device 124, the first electrode 121 of the second light-emitting device 125 is referred to herein as the third electrode 121, that is, the second light-emitting device 125 includes the third electrode 121, and the third electrode 121 is electrically connected to the second pixel circuit 136.

In this case, in the main display region A2, the orthographic projection of the second portion of the second pixel circuit 136 on the substrate 11 is located within the orthographic projection of the second light-shielding portion 16 on the substrate 11. That is, the orthographic projection of the second pixel circuit 136 on the substrate 11 is located within an orthographic projection of a whole of the third electrode 121 and the second light-shielding portion 16 on the substrate 11. In this way, it may be possible to avoid direct irradiation of external ambient light on the second pixel circuit 136, to reduce the reflection intensity of the external ambient light on the main display region A2 of the display panel 200, and to eliminate the diffraction phenomenon caused by direct irradiation of the external ambient light on a border of the second pixel circuit 136, so as to improve the display effect. Moreover, a channel portion S of a transistor 130 (e.g., the first transistor T1) in the second pixel circuit 136 may be shielded by the third electrode 121 and the second light-shielding portion 16, thereby reducing the risk of drift of a threshold voltage of the transistor 130, increasing the accuracy of the driving current, and improving the display effect of the main display region A2 of the display panel 200.

In some embodiments, as shown in FIGS. 9B and 9C, the second light-emitting devices 125 include red light-emitting devices 12R, green light-emitting devices 12G and blue light-emitting devices 12B.

Referring to FIG. 9B, an edge of a light-emitting region of the red light-emitting device 12R and an edge of a light-emitting region of the blue light-emitting device 12B are each substantially in a shape of a rhombus or a sector, and an edge of a light-emitting region of the green light-emitting device 12G is substantially in a shape of a rectangle. An area of the light-emitting region of the blue light-emitting device 12B is larger than an area of the light-emitting region of the red light-emitting device 12R, and the area of the light-emitting region of the red light-emitting device 12R is larger than an area of the light-emitting region of the green light-emitting device 12G.

Referring to FIGS. 9B, 9C, 9D and 10A, in the main display region A2, a third opening 161 of the second light-shielding portion 16 corresponding to the red light-emitting device 12R is substantially in a shape of a rhombus or a sector, so as to match the shape of the light-emitting region of the red light-emitting device 12R. A third opening 161 of the second light-shielding portion 16 corresponding to the green light-emitting device 12G is substantially in a shape of a rectangle, so as to match the shape of the light-emitting region of the green light-emitting device 12G. A third opening 161 of the second light-shielding portion 16 corresponding to the blue light-emitting device 12B is substantially in a shape of a rhombus or a sector, so as to match the shape of the light-emitting region of the blue light-emitting device 12B.

Figure 10B:
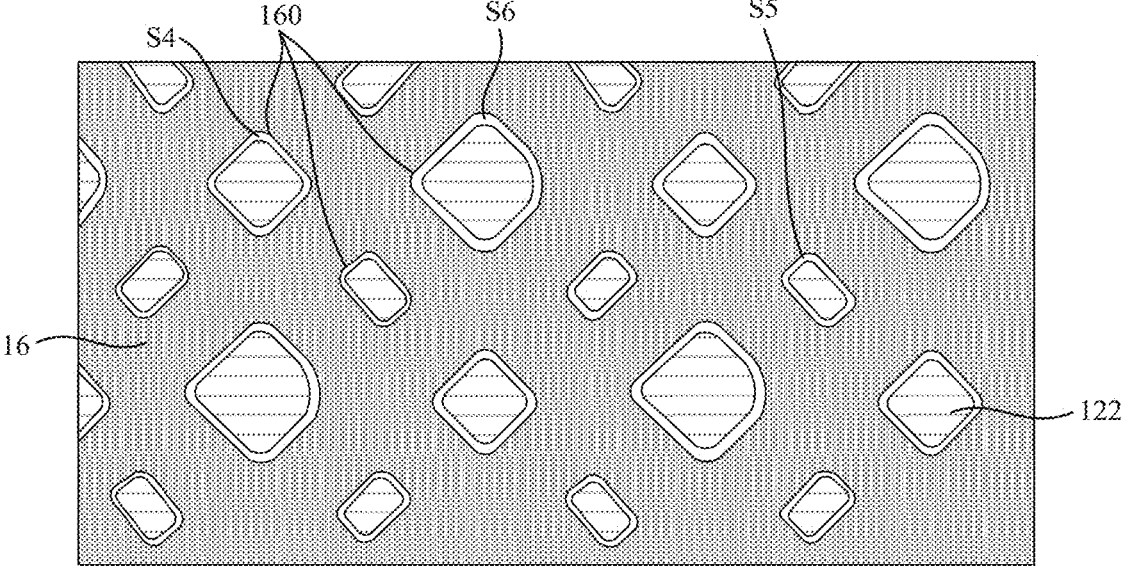
FIG. 10B is a diagram showing a relative positional relationship between a light-emitting region and a second light-shielding portion in a main display region of a display panel, in accordance with some embodiments.

Here, referring to FIGS. 9B and 10B, there is a fourth gap S4 between an edge 160 of the orthographic projection of the third opening of the second light-shielding portion 16 corresponding to the red light-emitting device 12R on the substrate 11 and an orthographic projection of the light-emitting region of the red light-emitting device 12R on the substrate 11 (referring to FIG. 3).

Referring to FIGS. 9B and 10B, there is a fifth gap S5 between an edge 160 of the orthographic projection of the third opening of the second light-shielding portion 16 corresponding to the green light-emitting device 12G on the substrate 11 and an orthographic projection of the light-emitting region of the green light-emitting device 12G on the substrate 11 (referring to FIG. 3).

Referring to FIGS. 9B and 10B, there is a sixth gap S6 between an edge 160 of the orthographic projection of the third opening of the second light-shielding portion 16 corresponding to the blue light-emitting device 12B on the substrate 11 and an orthographic projection of the light-emitting region of the blue light-emitting device 12B on the substrate 11 (referring to FIG. 3).

It will be noted that a region where the light-emitting functional layer 122 is located in FIGS. 9B and 10B may be regarded as the light-emitting region of the light-emitting device 12.

A width of the fourth gap S4, a width of the fifth gap S5 and a width of the sixth gap S6 are substantially equal, so as to avoid the problem of non-uniform brightness or color shift between the second sub-pixels P2, thereby improving the display effect of the main display region A2 of the display panel 200.

On this basis, the width of the first gap S1 and the width of the fourth gap S4 may be substantially equal, so as to avoid the problem of non-uniform brightness or color shift between the functional device setting region A1 and the main display region A2, thereby improving the display effect of the display panel 200.

It will be understood that the main display region A2 of the display panel 200 is only used for displaying images without collecting external ambient light. That is, in the main display region A2 of the display panel 200, a light transmittance of a region between second sub-pixels P2 does not need to be considered, and the lower the reflection intensity of the external ambient light is, the better the display effect is.

Based on this, referring to FIGS. 9A to 9D, the orthographic projection of the second light-shielding portion 16 on the substrate 11 covers a first region, and the first region is a region in the main display region A2 between the second light-emitting devices 125. In this case, a portion of a metal layer (e.g., the second electrode layer 1230) in the region between the second light-emitting devices 125 may be shielded by the second light-shielding portion 16, thereby reducing the reflection intensity of the external ambient light on the main display region A2 of the display panel 200, and improving the display effect of the main display region A2.

On this basis, a portion of the second electrode layer 1230 located in the main display region A2 may be of a continuous film layer structure, that is, the portion of the second electrode layer 1230 located in the main display region A2 may not be subjected to a patterning process, namely, a region of the second electrode layer 1230 located between the second sub-pixels P2 may not be provided with light-transmitting holes, and the process is simple.

In some embodiments, referring to FIG. 9B, the second light-emitting devices 125 include the red light-emitting devices 12R, the first green light-emitting devices 12G1, the second green light-emitting devices 12G2 and the blue light-emitting devices 12B, so as to improve the display effect of the display panel 200.

Red light-emitting devices 12R and first green light-emitting devices 12G1 are alternately arranged in a first oblique direction Z1, and red light-emitting devices 12R and second green light-emitting devices 12G2 are alternately arranged in a second oblique direction Z2. Blue light-emitting devices 12B and second green light-emitting devices 12G2 are alternately arranged in the first oblique direction Z1, and blue light-emitting devices 12B and first green light-emitting devices 12G1 are alternately arranged in the second oblique direction Z2. Red light-emitting devices 12R and blue light-emitting devices 12B are alternately arranged in a first direction X and a second direction Y, and first green light-emitting devices 12G1 and second green light-emitting devices 12G2 are alternately arranged in the first direction X and the second direction.

It will be noted that the first direction X is substantially perpendicular to the second direction Y, the first oblique direction Z1 intersects with the second oblique direction Z2, and both the first oblique direction Z1 and the second oblique direction Z2 intersect with the first direction X, and both the first oblique direction Z1 and the second oblique direction Z2 intersect with the second direction Y.

Here, in at least one of the first direction X, the second direction Y, the first oblique direction Z1 and the second oblique direction Z2, centers O2 of light-emitting regions of any two adjacent second light-emitting devices 125 have a substantially equal distance D2 therebetween. For example, in any of the first direction X, the second direction Y, the first oblique direction Z1 and the second oblique direction Z2, centers of light-emitting regions of any two adjacent second light-emitting devices 125 have a substantially equal distance therebetween.

In addition, the arrangement of the second pixel circuits 136 in the main display region A2 is regular to simplify the process difficulty. For example, in the main display region A2, as shown in FIG. 9A, the second pixel circuits 136 are arranged in a plurality of rows, and each row includes a plurality of second pixel circuits 136 arranged in the first direction X. In the second direction Y, second pixel circuits 136 in two adjacent rows are located in the same column. The first direction X is substantially perpendicular to the second direction Y.

It will be understood that, referring to FIG. 9B, the second light-emitting device 125 may be configured to emit white light, or may be configured to emit light of a single color.

For example, referring to FIG. 9C, the second light-emitting device 125 is configured to emit light of the single color, and the light of the single color is directly emitted to the outside of the display panel 200.

For example, as shown in FIGS. 9B and 9C, the second light-emitting devices 125 include the red light-emitting devices 12R, the first green light-emitting devices 12G1, the second green light-emitting devices 12G2 and the blue light-emitting devices 12B. The red light-emitting devices 12R are configured to emit red light, the first green light-emitting devices 12G1 and the second green light-emitting devices 12G2 are configured to emit green light, and the blue light-emitting devices 12B are configured to emit blue light, so as to achieve color display.

Figure 10C:
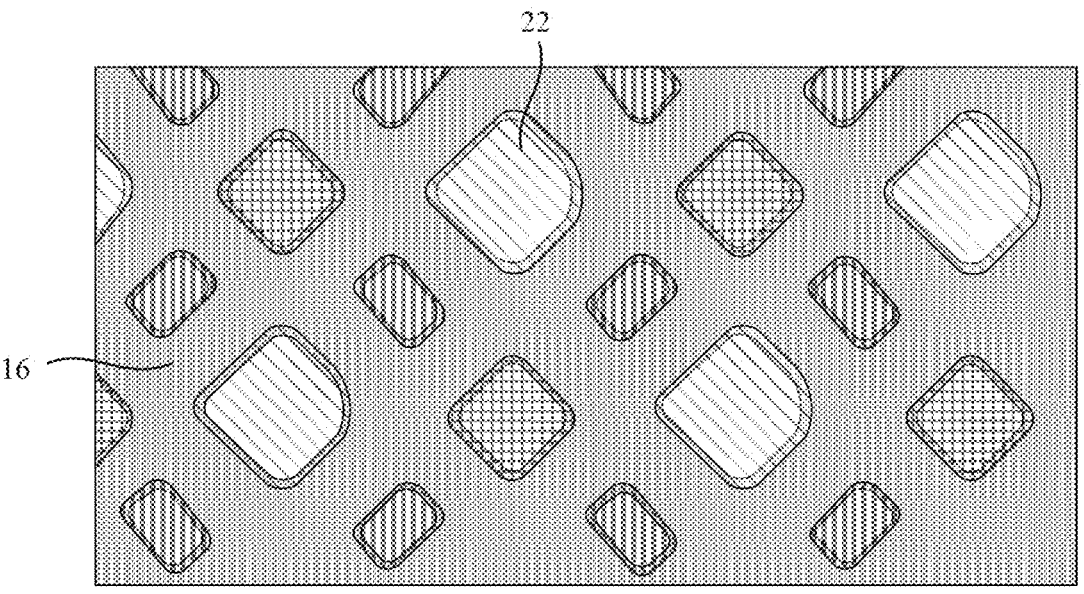
FIG. 10C is a diagram showing a relative positional relationship between a second light-shielding portion and a second light-filtering portion in a main display region of a display panel, in accordance with some embodiments.

Here, the display panel 200 may further include a plurality of second filter portions 22, and each second filter portion 22 corresponds to a third opening 161 (referring to FIG. 10A). In combination with FIG. 10C, an edge of an orthographic projection of the second filter portion 22 on the substrate 11 is located within the orthographic projection of the second light-shielding portion 16 on the substrate 11, so as to filter the light emitted by the second light-emitting device 125.

The plurality of second filter portions 22 may each transmit one of a variety of monochromatic lights. Light emitted by the red light-emitting device 12R is irradiated on the second filter portion 22 for transmitting red light, light emitted by the blue light-emitting device 12B is irradiated on the second filter portion 22 for transmitting blue light, and light emitted by the green light-emitting device 12G is irradiated on the second filter portion 22 for transmitting green light. Since the second filter portion 22 transmits monochromatic light, the second filter portion 22 may filter out light within most wavelength ranges in the external ambient light, thereby further reducing the reflection intensity of the external ambient light on the main display region A2 of the display panel 200. Thus, an anti-reflection polarizer (a circular polarizer) may not be provided on the display side of the display panel 200.

Figure 9D:
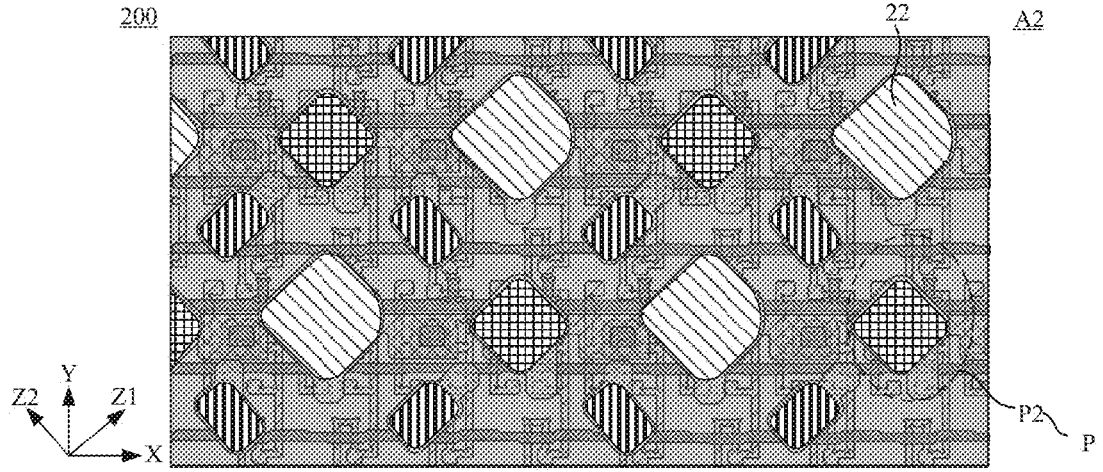
FIG. 9D is a top view of a main display region of another display panel that is provided with second light-shielding portions, in accordance with some embodiments.

For example, as shown in FIGS. 9B and 9D, the second light-emitting devices 125 are all configured to emit white light. In this case, the display panel 200 further includes the plurality of second filter portions 22, and each second filter portion 22 corresponds to the third opening 161 (referring to FIG. 10A). In combination with FIG. 10C, the edge of the orthographic projection of the second filter portion 22 on the substrate 11 is located within the orthographic projection of the second light-shielding portion 16 on the substrate 11, so as to filter the light emitted by the second light-emitting device 125.

The plurality of second filter portions 22 may each transmit one of a variety of monochromatic lights, and the white light emitted by the second light-emitting device 125 is irradiated on the corresponding second filter portion 22 to emit monochromatic light of a corresponding color, so as to realize full-color display.

For example, as shown in FIGS. 9B and 9D, the second light-emitting devices 125 include the red light-emitting devices 12R, the first green light-emitting devices 12G1, the second green light-emitting devices 12G2 and the blue light-emitting devices 12B. The second filter portion 22 of the red light-emitting device 12R may transmit red light, the second filter portions 22 of the first green light-emitting device 12G1 and the second green light-emitting device 12G2 may transmit green light, and the second filter portion 22 of the blue light-emitting device 12B may transmit blue light. In this case, white lights emitted by the red light-emitting devices 12R, the first green light-emitting devices 12G1, the second green light-emitting devices 12G2 and the blue light-emitting devices 12B are irradiated on respective second filter portions 22 to emit monochromatic light of corresponding colors, thereby realizing full-color display.

In addition, since the second filter portion 22 transmits monochromatic light, the second filter portion 22 may filter out light within most wavelength ranges in the external ambient light, thereby further reducing the reflection intensity of the external ambient light on the main display region A2 of the display panel 200. Thus, the anti-reflection polarizer (the circular polarizer) may not be provided on the display side of the display panel 200.

Figure 24:
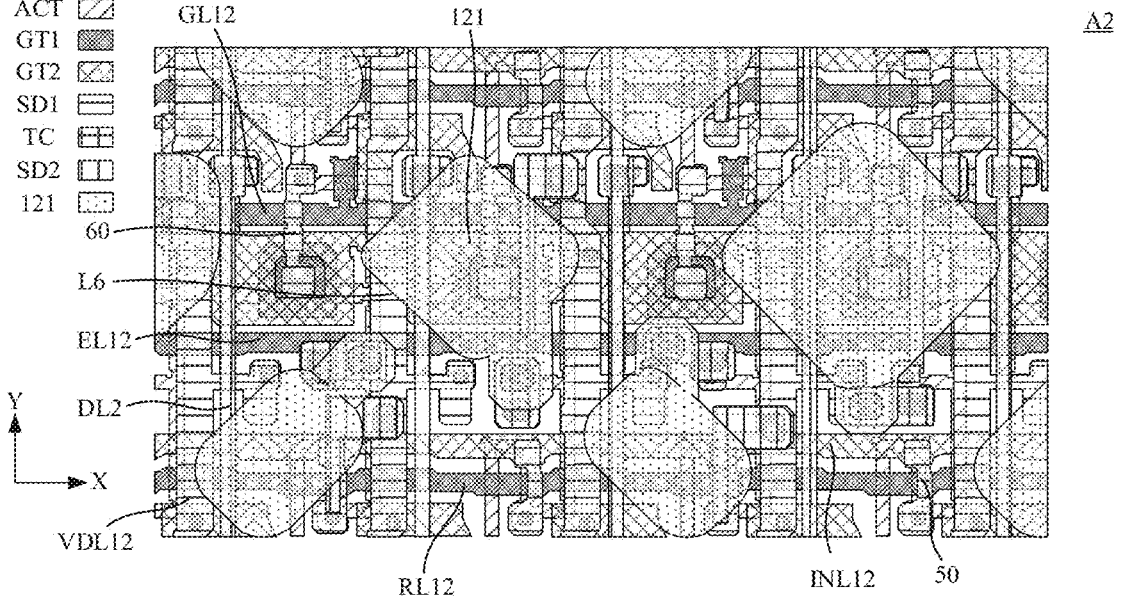
FIG. 24 is a top view of the main display region shown in FIG. 23 after a first electrode is added on the second source-drain conductive layer.

It will be understood that, referring to FIGS. 3, 17 and 24, the display panel 10 further includes a plurality of signal lines electrically connected to the pixel circuit 13 (including the first pixel circuit 135 and the second pixel circuit 136). At least one signal line includes a signal trace for connecting an external signal source and a transitional connection line connected to the first pixel circuit 135 (referring to FIG. 6A), and a portion of the signal trace located in the functional device setting region A1 is transparent, so as to improve the transmittance of the functional device setting region A1 of the display panel 200.

Figures 12, 13:
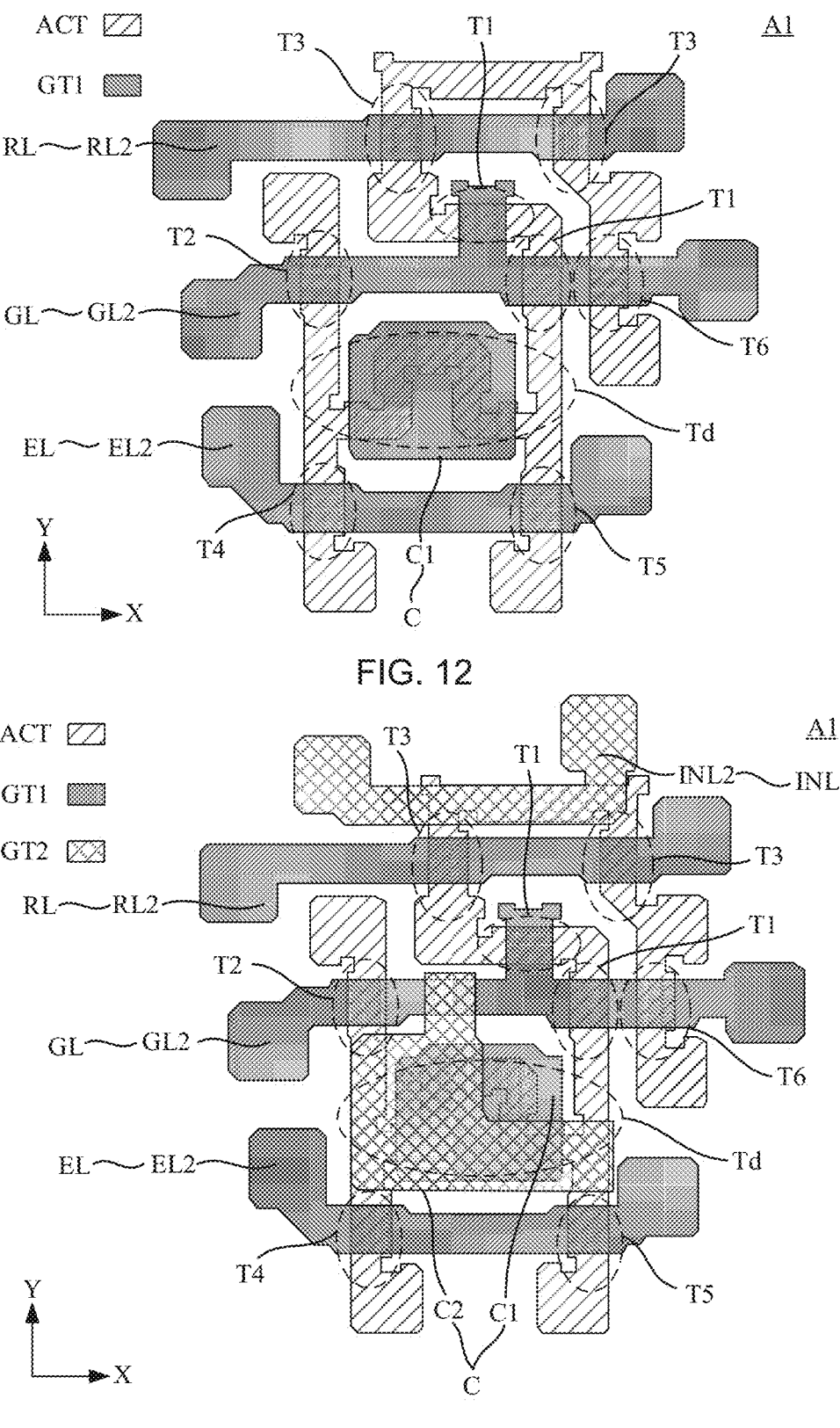
FIG. 12 is a top view of the functional device setting region shown in FIG. 11 after a first gate conductive layer is added on the semiconductor layer.
FIG. 13 is a top view of the functional device setting region shown in FIG. 12 after a second gate conductive layer is added on the first gate conductive layer.
Figure 16:
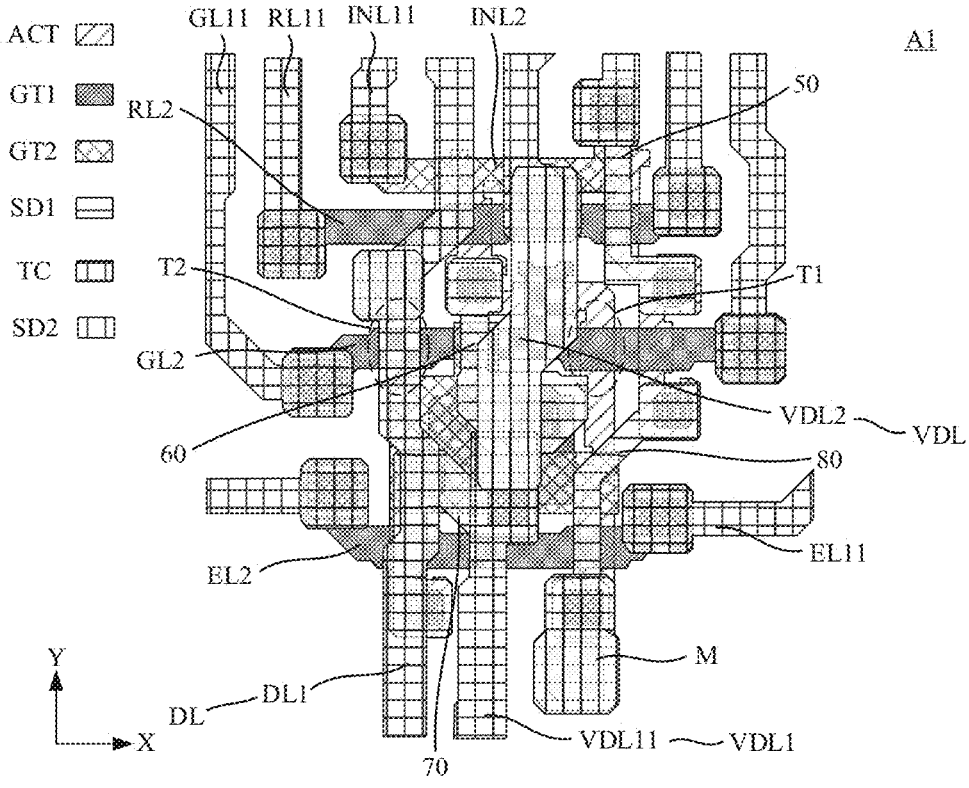
FIG. 16 is a top view of the functional device setting region shown in FIG. 15 after a second source-drain conductive layer is added on the transparent conductive layer.

For example, referring to FIGS. 3, 12 and 16, the plurality of signal lines include a scanning signal line GL, a reset signal line RL, an enable signal line EL, an initialization signal line INL, a first voltage signal line VDL and a data line DL.

The scanning signal line GL is electrically connected to the scanning signal terminal GATE of the pixel circuit 13, the reset signal line RL is electrically connected to the reset signal terminal RESET of the pixel circuit 13, the enable signal line EL is electrically connected to the enable signal terminal EM of the pixel circuit 13, the initialization signal line INL is electrically connected to the initialization signal terminal of the pixel circuit 13, the first voltage signal line VDL is electrically connected to the first voltage signal terminal VDD of the pixel circuit 13, and the data line DL is electrically connected to the data signal terminal DATA of the pixel circuit 13.

Figure 19:
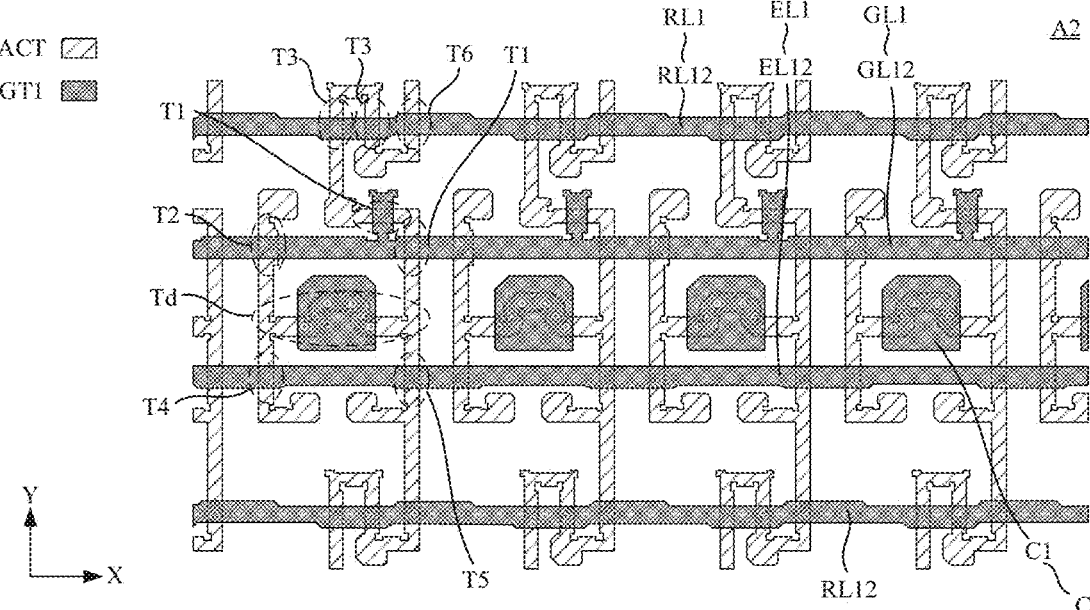
FIG. 19 is a top view of the main display region shown in FIG. 18 after a first gate conductive layer is added on the semiconductor layer.

In some embodiments, referring to FIGS. 12, 17 and 19, the scanning signal line GL includes a first scanning trace GL1 and a first transitional connection line GL2. The first transitional connection line GL2 extends substantially in the first direction X and is electrically connected to the first pixel circuit 135. An end of the first scanning trace GL1 extends into the functional device setting region A1 and is electrically connected to the first transitional connection line GL2. As a result, it may avoid cross interference between the trace arrangements of the scanning signal line GL and another signal line (e.g., a data line DATA).

On this basis, in the functional device setting region A1, a portion of the first scanning trace GL1 located in the functional device setting region A1 is transparent, so as to improve the transmittance of the functional device setting region A1 of the display panel 200.

Figures 14, 15:
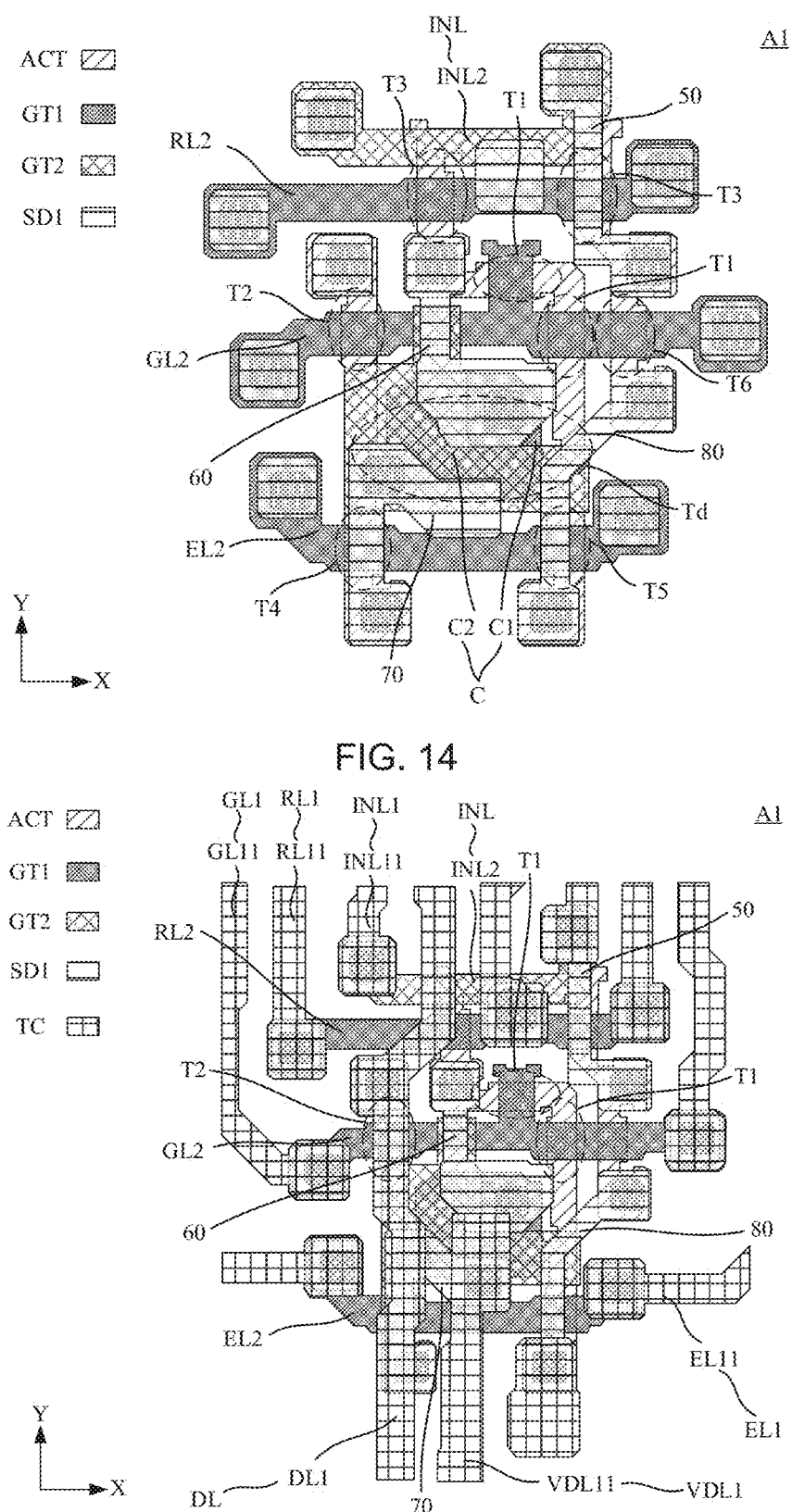
FIG. 14 is a top view of the functional device setting region shown in FIG. 13 after a first source-drain conductive layer is added on the second gate conductive layer.
FIG. 15 is a top view of the functional device setting region shown in FIG. 14 after a transparent conductive layer is added on the first source-drain conductive layer.

For example, as shown in FIGS. 15 and 19, the first scanning trace GL1 includes a first scanning sub-trace GL11 and a second scanning sub-trace GL12. The first scanning sub-trace GL11 is located in the functional device setting region A1, and the second scanning sub-trace GL12 is located in the main display region A2. The first scanning sub-trace GL11 is transparent, and the second scanning sub-trace GL12 may be transparent or opaque.

In some embodiments, referring to FIGS. 12, 15 and 19, the reset signal line RL includes a first reset trace RL1 and a second transitional connection line RL2. The second transitional connection line RL2 extends substantially in the first direction X and is electrically connected to the first pixel circuit 135. An end of the first reset trace RL1 extends into the functional device setting region A1 and is electrically connected to the second transitional connection line RL2. As a result, it may avoid cross interference between the trace arrangements of the reset signal line RL and another signal line (e.g., the data line DATA).

On this basis, in the functional device setting region A1, a portion of the first reset trace RL1 located in the functional device setting region A1 is transparent, so as to improve the transmittance of the functional device setting region A1 of the display panel 200.

For example, as shown in FIGS. 15 and 19, the first reset trace RL1 includes a first reset sub-trace RL11 and a second reset sub-trace RL12. The first reset sub-trace RL11 is located in the functional device setting region A1, and the second reset sub-trace RL12 is located in the main display region A2. The first reset sub-trace RL11 is transparent, and the second reset sub-trace RL12 may be transparent or opaque.

In some embodiments, referring to FIGS. 12, 15 and 19, the enable signal line EL includes a first enable trace EL1 and a third transitional connection line EL2. The third transitional connection line EL2 extends substantially in the first direction X and is electrically connected to the first pixel circuit 135. An end of the first enable trace EL1 extends into the functional device setting region A1 and is electrically connected to the third transitional connection line EL2. As a result, it may avoid cross interference between the trace arrangements of the enable signal line EL and another signal line (e.g., the data line DATA).

On this basis, in the functional device setting region A1, a portion of the first enable trace EL1 located in the functional device setting region A1 is transparent, so as to improve the transmittance of the functional device setting region A1 of the display panel 200.

For example, as shown in FIGS. 15 and 19, the first enable trace EL1 includes a first enable sub-trace EL11 and a second enable sub-trace EL12. The first enable sub-trace EL11 is located in the functional device setting region A1, and the second enable sub-trace EL12 is located in the main display region A2. The first enable sub-trace EL11 is transparent, and the second enable sub-trace EL12 may be transparent or opaque.

Figure 20:
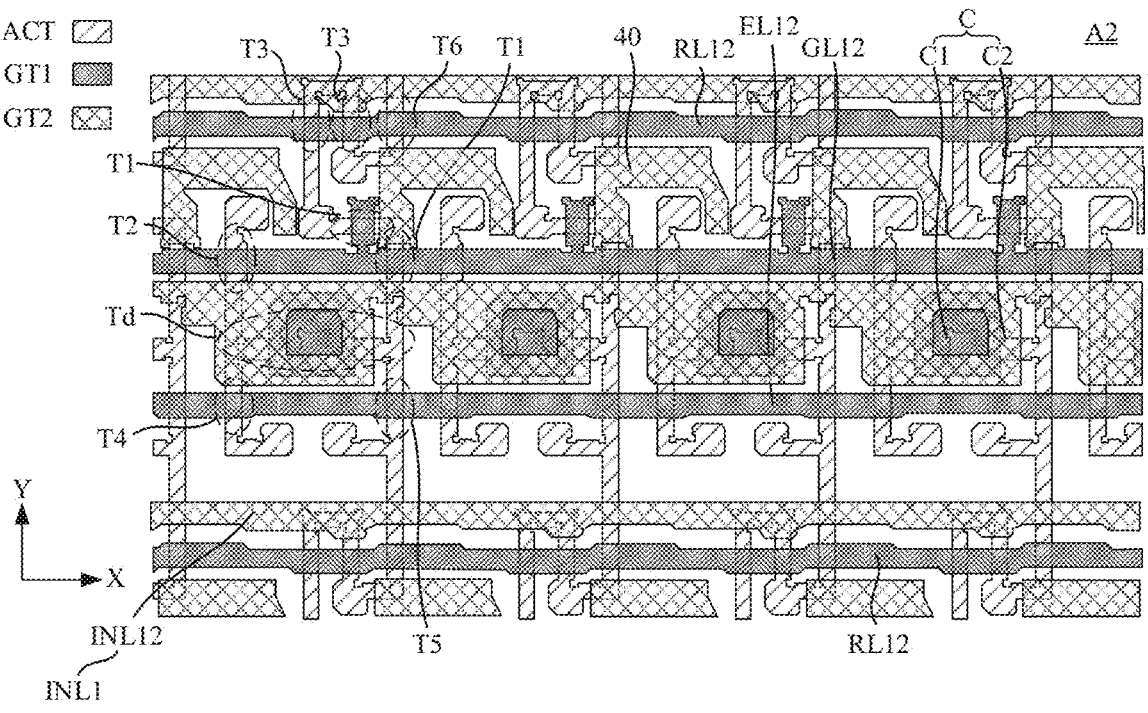
FIG. 20 is a top view of the main display region shown in FIG. 19 after a second gate conductive layer is added on the first gate conductive layer.

In some embodiments, referring to FIGS. 13, 15 and 20, the initialization signal line INL includes a first initialization trace INL1 and a fourth transitional connection line INL2. The fourth transitional connection line INL2 extends substantially in the first direction X and is electrically connected to the first pixel circuit 135. An end of the first initialization line INL1 extends into the functional device setting region A1 and is electrically connected to the fourth transitional connection line INL2. As a result, it may avoid cross interference between the trace arrangements of the initialization signal line INL and another signal line (e.g., the data line DATA).

On this basis, in the functional device setting region A1, a portion of the first initialization trace INL1 located in the functional device setting region A1 is transparent, so as to improve the transmittance of the functional device setting region A1 of the display panel 200.

For example, as shown in FIGS. 15 and 20, the first initialization trace INL1 includes a first initialization sub-trace INL11 and a second initialization sub-trace INL12. The first initialization sub-trace INL11 is located in the functional device setting region A1, and the second initialization sub-trace INL12 is located in the main display region A2. The first initialization sub-trace INL11 is transparent, and the second initialization sub-trace INL12 may be transparent or opaque.

Figure 23:
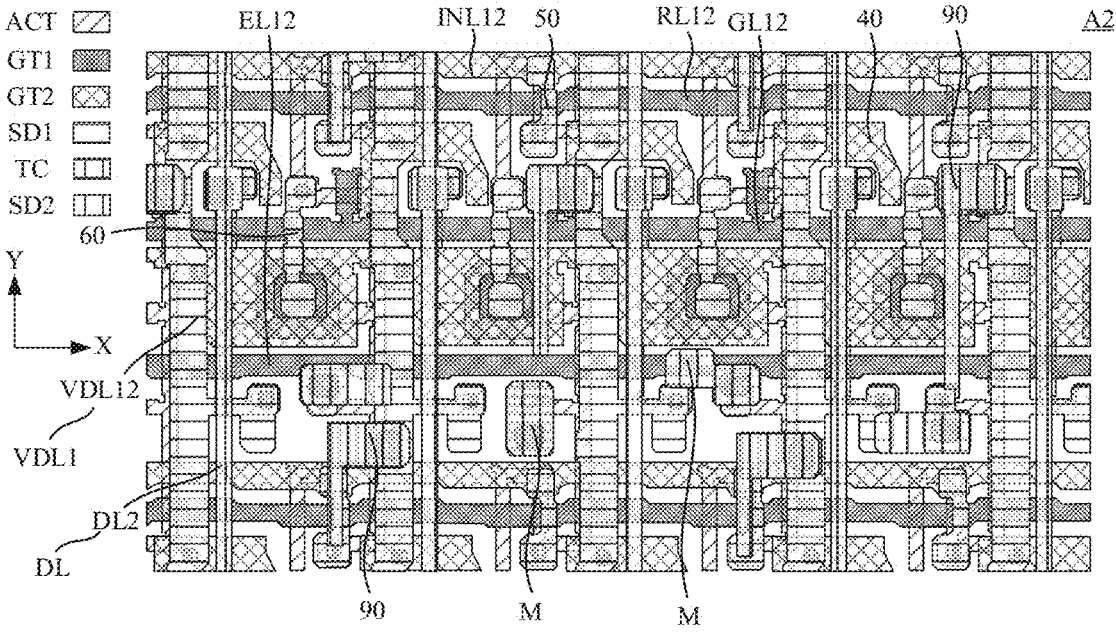
FIG. 23 is a top view of the main display region shown in FIG. 22 after a second source-drain conductive layer is added on the transparent conductive layer.

In some embodiments, referring to FIGS. 16 and 23, the first voltage signal line VDL and the data line DL extend substantially in the second direction Y. In the functional device setting region A1, at least portions of the first voltage signal line VDL and the data line DL located in the functional device setting region A1 are transparent, so as to improve the transmittance of the functional device setting region A1 of the display panel 200.

For example, as shown in FIGS. 16 and 23, the first voltage signal line VDL includes a first voltage trace VDL1 and a fifth transitional connection line VDL2. The fifth transitional connection line VDL2 is disposed on a side of the first pixel circuit 135 away from the substrate 11 and is electrically connected to the first voltage trace VDL1. That is, the fifth transitional connection line VDL2 crosses over the first pixel circuit 135 (referring to FIG. 6A). In this case, the first voltage signal line VDL may be pulled away from the first pixel circuit 135 (referring to FIG. 6A) through the fifth transitional connection line VDL2 when passing over the first pixel circuit 135 (referring to FIG. 6A), thereby reducing electromagnetic interference.

On this basis, as shown in FIGS. 16 and 23, the first voltage trace VDL1 may include a first voltage sub-trace VDL11 and a second voltage sub-trace VDL12. The first voltage sub-trace VDL11 is located in the functional device setting region A1, and the second voltage sub-trace VDL12 is located in the main display region A2. The data line DL includes a first data sub-line DL1 and a second data sub-line DL2. The first data sub-line DL1 is located in the functional device setting region A1, and the second data sub-line DL2 is located in the main display region A2. The first voltage sub-trace VDL11 and the first data sub-line DL1 may both be transparent.

The signal lines included in respective film layers and some other pattern film layers are exemplarily described below in combination with the film layer structure of the display substrate 10.

As shown in FIGS. 17 and 24, in a direction perpendicular to the substrate 11 and away from the substrate 11, the display substrate 10 sequentially includes a semiconductor layer ACT, a first gate conductive layer GT1, a second gate conductive layer GT2, a first source-drain conductive layer SD1, a transparent conductive layer TC and a second source-drain conductive layer SD2.

It will be noted that, among the semiconductor layer ACT, the first gate conductive layer GT1, the second gate conductive layer GT2, the first source-drain conductive layer SD1, the transparent conductive layer TC and the second source-drain conductive layer SD2, an insulating film layer is provided between any two adjacent layers, referring to FIG. 3, such as a first gate insulating layer GI1, a second gate insulating layer GI2, an interlayer insulating layer ILD, a first planarization layer PLN1 and a second planarization layer PLN2, which is not limited in the embodiments of the present disclosure.

Figure 11:
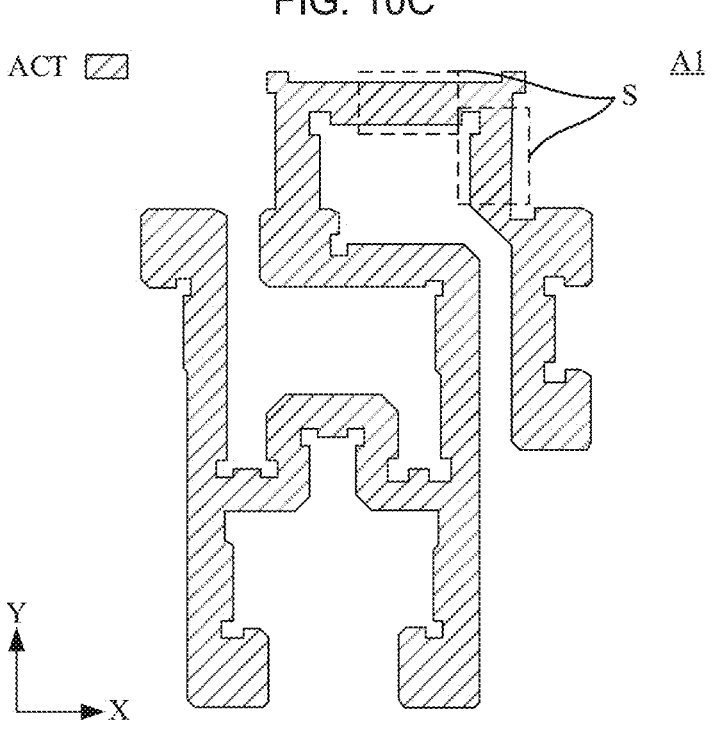
FIG. 11 is a top view of a semiconductor layer in a functional device setting region of a display panel, in accordance with some embodiments.
Figure 18:
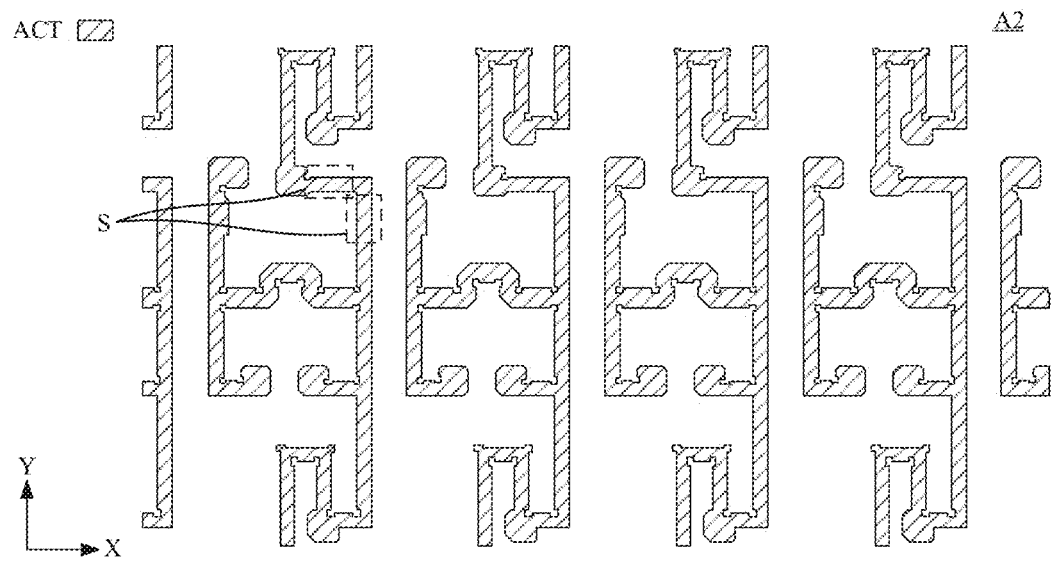
FIG. 18 is a top view of a semiconductor layer in a main display region of a display panel, in accordance with some embodiments.

As shown in FIGS. 3, 11 and 18, the semiconductor layer ACT includes channel portions S of respective transistors 130 in the pixel circuit 13, and sources 131 (not shown in FIGS. 11 and 18) and drains 132 (not shown in FIGS. 11 and 18) of some transistors 130 in the pixel circuit 13.

It will be noted that a material of the semiconductor layer ACT includes amorphous silicon, monocrystalline silicon, polycrystalline silicon or metal oxide semiconductor. For example, the material of the semiconductor layer ACT includes indium gallium zinc oxide and/or zinc oxide, and the embodiments of the present disclosure are not limited thereto.

As shown in FIGS. 12 and 19, the first gate conductive layer GT1 includes the first transitional connection line GL2, the second transitional connection line RL2, the third transitional connection line EL2, the second scanning sub-trace GL12, the second reset sub-trace RL12, the second enable sub-trace EL12 and the first electrode plate C1 of the storage capacitor C. That is, the first transitional connection line GL2, the second transitional connection line RL2, the third transitional connection line EL2, the second scanning sub-trace GL12, the second reset sub-trace RL12, the second enable sub-trace EL12 and the first electrode plate C1 of the storage capacitor C are disposed in the same layer and are all located in the first gate conductive layer GT1.

It will be noted that a material of the first gate conductive layer GT1 includes metal. For example, the material of the first gate conductive layer GT1 includes at least one of aluminum, copper and molybdenum, and the embodiments of the present disclosure are not limited thereto. That is, materials of the first transitional connection line GL2, the second transitional connection line RL2, the third transitional connection line EL2 and the first electrode plate C1 of the storage capacitor C include metal.

Referring to FIG. 12, portions of the first transitional connection line GL2 overlapped with the semiconductor layer ACT form control electrodes of the first transistor T1, the second transistor T2 and the sixth transistor T6; portions of the second transitional connection line RL2 overlapped with the semiconductor layer ACT form the control electrode of the third transistor T3; and portions of the third transitional connection line EL2 overlapped with the semiconductor layer form control electrodes of the fourth transistor T4 and the fifth transistor T5. The first electrode plate C1 of the storage capacitor C located in the functional device setting region A1 is located between the first transitional connection line GL2 and the third transitional connection line EL2.

In addition, referring to FIG. 19, portions of the second reset sub-trace RL12 overlapped with the semiconductor layer ACT form control electrodes of the third transistor T3 and the sixth transistor T6; portions of the second scanning sub-trace GL12 overlapped with the semiconductor layer form control electrodes of the first transistor T1 and the second transistor T2; and portions of the second enable sub-trace EL12 overlapped with the semiconductor layer ACT form control electrodes of the fourth transistor T4 and the fifth transistor T5. The first electrode plate C1 of the storage capacitor C located in the main display region A2 is located between the second scanning sub-trace GL12 and the second enable sub-trace EL12.

As shown in FIGS. 13 and 20, the second gate conductive layer GT2 includes the fourth transitional connection line INL2, the second initialization sub-trace INL12 and the second electrode plate C2 of the storage capacitor C. An orthographic projection of the second electrode plate C2 on the substrate 11 partially overlaps with an orthographic projection of the first electrode plate C1 on the substrate 11.

It will be noted that a material of the second gate conductive layer GT2 includes metal. For example, the material of the second gate conductive layer GT2 includes at least one of aluminum, copper and molybdenum, and the embodiments of the present disclosure are not limited thereto.

Referring to FIGS. 13 and 20, portions, where the orthographic projections thereof on the substrate 11 are overlapped, of the second electrode plate C2 and the first electrode plate C1 form the storage capacitor C. The fourth transitional connection line INL2 is electrically connected to the third transistor T3 and the sixth transistor T6 in the first pixel circuit 135 through connection lines; and the second initialization sub-trace INL12 is electrically connected to the third transistor T3 and the sixth transistor T6 in the second pixel circuit 136 through connection lines.

Figure 21:
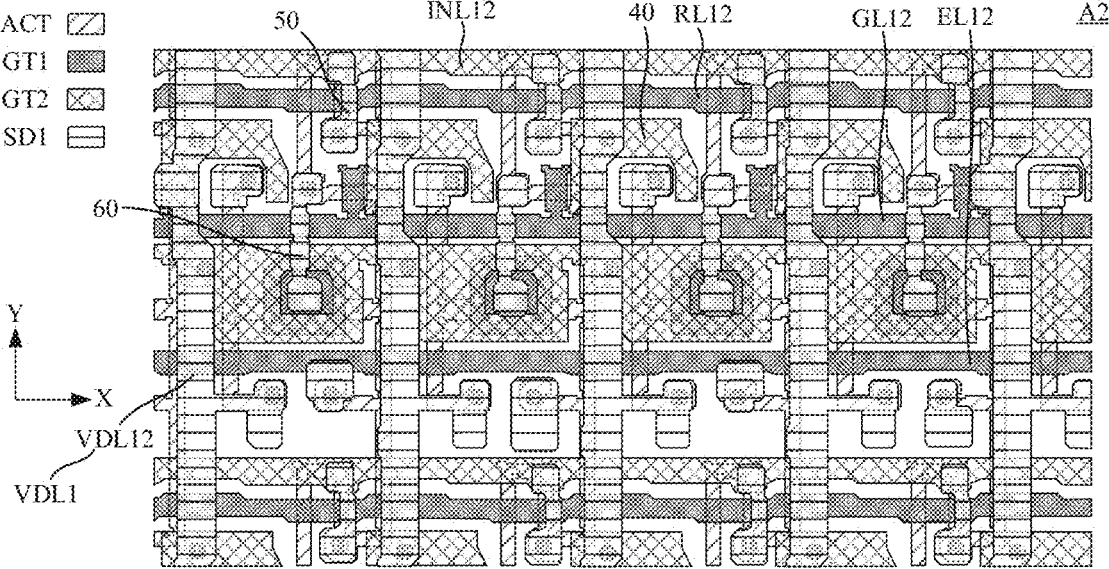
FIG. 21 is a top view of the main display region shown in FIG. 20 after a first source-drain conductive layer is added on the second gate conductive layer.

In some embodiments, referring to FIGS. 20 and 21, the second gate conductive layer GT2 further includes shielding patterns 40 located in the main display region A2, and the shielding pattern 40 is located between the second reset sub-trace RL12 and the second scanning sub-trace GL12. An orthographic projection of the shielding pattern 40 on the substrate 11 at least partially overlaps with an orthographic projection of the second voltage sub-trace VDL12 on the substrate 11, and the shielding pattern 40 is electrically connected to the second voltage sub-trace VDL12, so as to reduce electromagnetic interference between the traces.

As shown in FIGS. 14 and 21, the first source-drain conductive layer SD1 includes a first connection line 50, a second connection line 60, a third connection line 70, a fourth connection line 80 and the second voltage sub-trace VDL12. The first connection line 50 and the second connection line 60 are distributed in both the functional device setting region A1 and the main display region A2, and the third connection line 70 and the fourth connection line 80 are only distributed in the functional device setting region A1.

It will be noted that a material of the first source-drain conductive layer SD1 includes metal. For example, the material of the first source-drain conductive layer SD1 includes at least one of aluminum, copper and molybdenum, and the embodiments of the present disclosure are not limited thereto.

In the functional device setting region A1, as shown in FIGS. 13 and 14, the first connection line 50 is electrically connected to the first electrode of the third transistor T3 and the first electrode of the sixth transistor T6. The second connection line 60 is electrically connected to the first electrode plate C1 of the storage capacitor C, the second electrode of the first transistor T1 and the second electrode of the third transistor T3. The third connection line 70 is electrically connected to the second electrode plate C2 of the storage capacitor C and the first electrode of the fourth transistor T4. The fourth connection line 80 is electrically connected to the second electrode of the fifth transistor T5 and the second electrode of the sixth transistor T6.

In the main display region A2, as shown in FIGS. 20 and 21, the first connection line 50 is electrically connected to the first electrode of the third transistor T3 and the first electrode of the sixth transistor T6. The second connection line 60 is electrically connected to the first electrode plate C1 of the storage capacitor C, the second electrode of the first transistor T1 and the second electrode of the third transistor T3.

Figure 22:
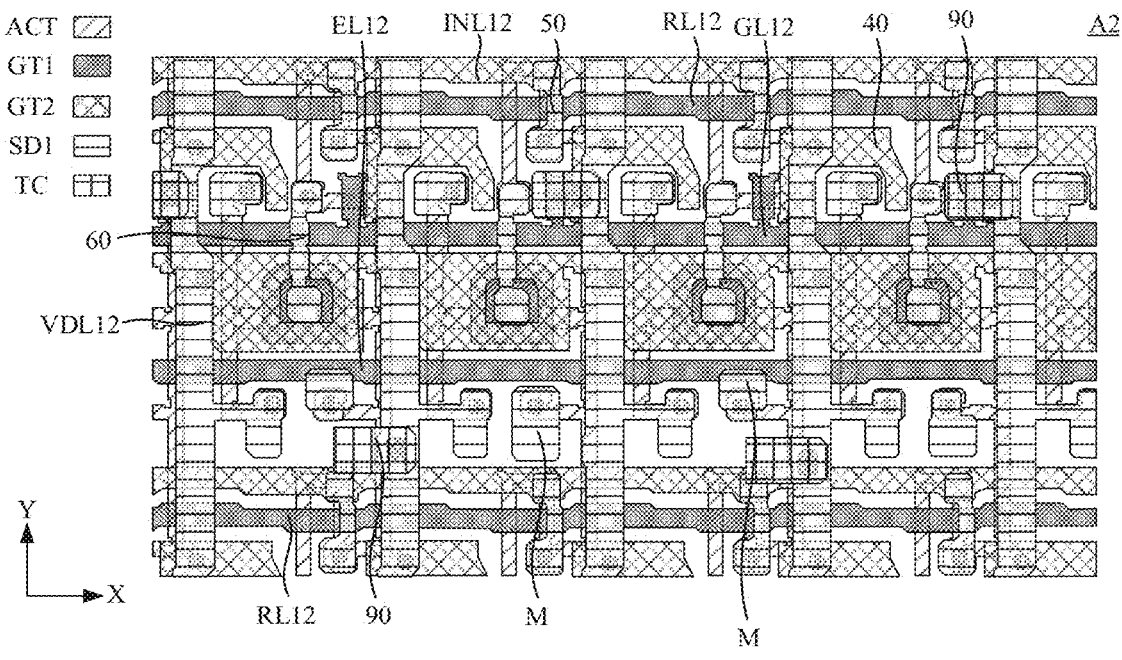
FIG. 22 is a top view of the main display region shown in FIG. 21 after a transparent conductive layer is added on the first source-drain conductive layer.

As shown in FIGS. 15 and 22, at least portions of the first scanning trace GL1, the first reset trace RL1, the first enable trace EL1, the first initialization trace INL1, the data line DL and the first voltage signal line VDL located in the functional device setting region A1 are transparent.

For example, as shown in FIGS. 15 and 22, the transparent conductive layer TC includes the first scanning sub-trace GL11, the first reset sub-trace RL11, the first enable sub-trace EL11, the first initialization sub-trace INL11, the first voltage sub-trace VDL11 and the first data sub-line DL1.

It will be noted that a material of the transparent conductive layer TC includes a transparent conductive material, and the transparent conductive layer TC prepared from the transparent conductive material has a transmittance greater than or equal to 60%. For example, the material of the transparent conductive layer TC includes indium tin oxide, and the embodiments of the present disclosure are not limited thereto.

As shown in FIGS. 16 and 23, the fifth transitional connection line VDL2 and the second data sub-line DL2 may both be located in the second source-drain conductive layer SD2.

It will be noted that a material of the second source-drain conductive layer SD2 includes metal. For example, the material of the second source-drain conductive layer SD2 includes at least one of aluminum, copper and molybdenum, and the embodiments of the present disclosure are not limited thereto.

In addition, referring to FIG. 23, the second source-drain conductive layer SD2 may further include a support pattern 90 located in the main display region A2. The support pattern 90 and the second data sub-line DL2 are disposed on both sides of the second pixel circuit 136 in parallel, so as to support and balance the first electrode 121 of the light-emitting device 12. Moreover, the support pattern 90 may be electrically connected to the second voltage sub-trace VDL12, which may also function to reduce electromagnetic interference between signal lines.

Based on the above, pads M in the pixel circuit 13 may each be composed of one or more layers of pad patterns formed in the first source-drain conductive layer SD1, the transparent conductive layer TC and the second source-drain conductive layer SD2. For example, the pad M is formed by sequentially stacking a pad pattern of the first source-drain conductive layer SD1, a pad pattern of the transparent conductive layer TC and a pad pattern of the second source-drain conductive layer SD2.

The foregoing descriptions are merely specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A display panel having a functional device setting region, the display panel comprising:

a substrate;

a plurality of first pixel circuits disposed on the substrate and located in the functional device setting region;

a plurality of first light-emitting devices disposed on a side of the plurality of first pixel circuits away from the substrate and located in the functional device setting region, wherein a first light-emitting device includes a first electrode, the first electrode is electrically connected to a first pixel circuit, and a portion of an orthographic projection of the first pixel circuit on the substrate is located outside an orthographic projection of the first electrode on the substrate;

a plurality of first light-shielding portions arranged at intervals on a side of the plurality of first light-emitting devices away from the substrate and located in the functional device setting region, wherein each first light-shielding portion is provided with a first opening therein, and each first opening corresponds to a single first light-emitting device; a light-emitting region of the first light-emitting device is located in a corresponding first opening; an orthographic projection of a first portion of the first pixel circuit on the substrate is located within an orthographic projection of a first light-shielding portion on the substrate; the first portion is a portion, an orthographic projection of which on the substrate is located outside the orthographic projection of the first electrode on the substrate, of the first pixel circuit; and a second electrode layer disposed between the first electrode and the first light-shielding portion, wherein a portion of the second electrode layer located in the functional device setting region is provided with a plurality of second openings therein, and orthographic projections of the plurality of second openings on the substrate are each located in a region between orthographic projections of the plurality of first light-shielding portions on the substrate;

wherein an edge of the orthographic projection of the first electrode of the first light-emitting device on the substrate is located within the orthographic projection of the first light-shielding portion on the substrate;

the first electrode includes a main body portion and a connection portion; the main body portion is configured to be as the light-emitting region, and the connection portion is electrically connected to the first pixel circuit;

the first light-shielding portion includes a first light-shielding sub-portion and a second light-shielding sub-portion, and the orthographic projection of the first portion on the substrate is located within an orthographic projection of a first light-shielding sub-portion on the substrate;

an edge of an orthographic projection of the main body portion on the substrate is completely located within the orthographic projection of the first light-shielding sub-portion on the substrate;

an edge of an orthographic projection of the connection portion on the substrate is located within an orthographic projection of the second light-shielding sub-portion on the substrate; and an edge of the orthographic projection of the second light-shielding sub-portion on the substrate and an edge of an orthographic projection of the first opening on the substrate have a gap therebetween.

2. The display panel according to claim 1, wherein the plurality of first light-emitting devices include red light-emitting devices, green light-emitting devices and blue light-emitting devices; the plurality of first light-shielding portions include red light-shielding portions, green light-shielding portions and blue light-shielding portions; a first opening of a red light-shielding portion corresponds to a red light-emitting device, a first opening of a green light-shielding portion corresponds to a green light-emitting device, and a first opening of a blue light-shielding portion corresponds to a blue light-emitting device; and an edge of a light-emitting region of the red light-emitting device is substantially in a shape of a rhombus or a sector, and the first opening of the red light-shielding portion is substantially in a shape of a rhombus or a sector; and/or an edge of a light-emitting region of the green light-emitting device is substantially in a shape of a rectangle, and the first opening of the green light-shielding portion is substantially in a shape of a rectangle; and/or an edge of a light-emitting region of the blue light-emitting device is substantially in a shape of a rhombus or a sector, and the first opening of the blue light-shielding portion is substantially in a shape of a rhombus or a sector.

3. The display panel according to claim 2, wherein an orthographic projection of the light-emitting region of the red light-emitting device on the substrate and an inner edge of an orthographic projection of the red light-shielding portion on the substrate have a first gap therebetween;

an orthographic projection of the light-emitting region of the green light-emitting device on the substrate and an inner edge of an orthographic projection of the green light-shielding portion on the substrate have a second gap therebetween;

an orthographic projection of the light-emitting region of the blue light-emitting device on the substrate and an inner edge of an orthographic projection of the blue light-shielding portion on the substrate have a third gap therebetween; and widths of the first gap, the second gap and the third gap are substantially equal.

4. The display panel according to claim 2, wherein each first light-shielding portion includes a first light-shielding sub-portion and a second light-shielding sub-portion; an outer edge of an orthographic projection of a first light-shielding sub-portion of the red light-shielding portion on the substrate is substantially in a shape of a rhombus or a sector; and/or an outer edge of an orthographic projection of a first light-shielding sub-portion of the green light-shielding portion on the substrate is substantially in a shape of a circle or an ellipse; and/or an outer edge of an orthographic projection of a first light-shielding sub-portion of the blue light-shielding portion on the substrate is substantially in a shape of a rhombus or a sector.

5. The display panel according to claim 1, wherein the plurality of first pixel circuits are arranged in a plurality of rows and a plurality of columns, each row of first pixel circuits includes first pixel circuits arranged in a first direction, and each column of first pixel circuits includes first pixel circuits arranged in a second direction; the first direction is substantially perpendicular to the second direction; and first pixel circuits in two adjacent rows are staggered from each other, and first pixel circuits in two adjacent columns are staggered from each other.

6. The display panel according to claim 5, wherein the plurality of first light-shielding portions are arranged in a plurality of rows and a plurality of columns, each row of first light-shielding portions includes first light-shielding portions arranged in the first direction, and each column of first light-shielding portions includes first light-shielding portions arranged in the second direction; and first light-shielding portions in two adjacent rows are staggered from each other, and first light-shielding portions in two adjacent columns are staggered from each other.

7. The display panel according to claim 1, wherein the plurality of first light-shielding portions are arranged in a plurality of rows and a plurality of columns, each row of first light-shielding portions includes first light-shielding portions arranged in a first direction, and each column of first light-shielding portions includes first light-shielding portions arranged in a second direction; the first direction is substantially perpendicular to the second direction; and a second opening is disposed between two adjacent first light-shielding portions in the first direction, and/or another second opening is disposed between two adjacent first light-shielding portions in the second direction; and/or the second opening is substantially in a shape of a circle or an ellipse.

8. The display panel according to claim 1, further having a main display region, the main display region at least partially surrounding the functional device setting region; the display panel further comprising:

a plurality of second pixel circuits disposed on the substrate and located in the main display region;

a plurality of second light-emitting devices disposed on a side of the plurality of second pixel circuits away from the substrate and located in the main display region, wherein a second light-emitting device includes a third electrode, the third electrode is electrically connected to a second pixel circuit, and a portion of an orthographic projection of the second pixel circuit on the substrate is located outside an orthographic projection of the third electrode on the substrate; and a second light-shielding portion disposed on a side of the plurality of second light-emitting devices away from the substrate and located in the main display region, wherein the second light-shielding portion includes a plurality of third openings, and each third opening corresponds to a single second light-emitting device; a light-emitting region of the second light-emitting device is located in a corresponding third opening; orthographic projections of second portions of the plurality of second pixel circuits on the substrate are each located within an orthographic projection of the second light-shielding portion on the substrate; a second portion is a portion, an orthographic projection of which on the substrate is located outside the orthographic projection of the third electrode on the substrate, of the second pixel circuit.

9. The display panel according to claim 8, wherein the plurality of first light-shielding portions and the second light-shielding portion are made of a same material and are disposed in a same layer.

10. The display panel according to claim 8, wherein the plurality of second light-emitting devices include red light-emitting devices, green light-emitting devices and blue light-emitting devices;

an edge of a light-emitting region of a red light-emitting device is substantially in a shape of a rhombus or a sector, and a third opening corresponding to the red light-emitting device in the second light-shielding portion is substantially in a shape of a rhombus or a sector; and/or an edge of a light-emitting region of a green light-emitting device is substantially in a shape of a rectangle, and a third opening corresponding to the green light-emitting device in the second light-shielding portion is substantially in a shape of a rectangle; and/or an edge of a light-emitting region of a blue light-emitting device is substantially in a shape of a rhombus or a sector, and a third opening corresponding to the blue light-emitting device in the second light-shielding portion is substantially in a shape of a rhombus or a sector.

11. The display panel according to claim 10, wherein an orthographic projection of the light-emitting region of the red light-emitting device on the substrate and an edge of an orthographic projection of the third opening of the second light-shielding portion corresponding to the red light-emitting device on the substrate have a fourth gap therebetween;

an orthographic projection of the light-emitting region of the green light-emitting device on the substrate and an edge of an orthographic projection of the third opening of the second light-shielding portion corresponding to the green light-emitting device on the substrate have a fifth gap therebetween;

an orthographic projection of the light-emitting region of the blue light-emitting device on the substrate and an edge of an orthographic projection of the third opening of the second light-shielding portion corresponding to the blue light-emitting device on the substrate have a sixth gap therebetween; and widths of the fourth gap, the fifth gap and the sixth gap are substantially equal.

12. The display panel according to claim 8, wherein the plurality of first light-emitting devices and the plurality of second light-emitting devices each include a plurality of red light-emitting devices, a plurality of first green light-emitting devices, a plurality of second green light-emitting devices and a plurality of blue light-emitting devices;

red light-emitting devices and first green light-emitting devices are alternately arranged in a first oblique direction, and red light-emitting devices and second green light-emitting devices are alternately arranged in a second oblique direction; blue light-emitting devices and second green light-emitting devices are alternately arranged in the first oblique direction, and blue light-emitting devices and first green light-emitting devices are alternately arranged in the second oblique direction; and red light-emitting devices and blue light-emitting devices are alternately arranged in a first direction and in a second direction, and first green light-emitting devices and second green light-emitting devices are alternately arranged in the first direction and in the second direction; and the first direction is substantially perpendicular to the second direction, the first oblique direction intersects with the second oblique direction, both the first oblique direction and the second oblique direction intersect with the first direction, and both the first oblique direction and the second oblique direction intersect with the second direction.

13. The display panel according to claim 12, wherein in at least one of the first direction, the second direction, the first oblique direction and the second oblique direction, centers of light-emitting regions of any two adjacent first light-emitting devices have a substantially equal distance therebetween, and/or centers of light-emitting regions of any two adjacent second light-emitting devices have a substantially equal distance.

14. The display panel according to claim 1, further comprising:

a plurality of first filter portions, wherein each first filter portion corresponds to a single first opening, and an edge of an orthographic projection of the first filter portion on the substrate is located within an orthographic projection of a corresponding first light-shielding portion on the substrate; or the display panel further having a main display region and further comprising:

a plurality of second pixel circuits disposed on the substrate and located in the main display region;

a plurality of second light-emitting devices disposed on a side of the plurality of second pixel circuits away from the substrate and located in the main display region; wherein a second light-emitting device includes a third electrode, the third electrode is electrically connected to a second pixel circuit, and a portion of an orthographic projection of the second pixel circuit on the substrate is located outside an orthographic projection of the third electrode on the substrate;

a second light-shielding portion disposed on a side of the plurality of second light-emitting devices away from the substrate and located in the main display region; wherein the second light-shielding portion includes a plurality of third openings, and each third opening corresponds to a single second light-emitting device; a light-emitting region of the second light-emitting device is located in a corresponding third opening;

a plurality of first filter portions, wherein each first filter portion corresponds to a single first opening, and an edge of an orthographic projection of the first filter portion on the substrate is located within an orthographic projection of a corresponding first light-shielding portion on the substrate; and a plurality of second filter portions, wherein each second filter portion corresponds to a single third opening, and an edge of an orthographic projection of the second filter portion on the substrate is located within an orthographic projection of the second light-shielding portion on the substrate.

15. The display panel according to claim 1, further comprising:

an encapsulation layer disposed between the plurality of first light-shielding portions and the plurality of first light-emitting devices.

16. The display panel according to claim 1, further comprising:

a plurality of signal lines electrically connected to the first pixel circuit, at least one signal line including a signal trace for connecting an external signal source and a transitional connection line connected to the first pixel circuit, and a portion of the signal trace located in the functional device setting region being transparent.

17. A display apparatus, comprising the display panel according to claim 1.

*   *   *   *   *